US012765120B2

(12) United States Patent
Chu et al.

(10) Patent No.: US 12,765,120 B2
(45) Date of Patent: Oct. 13, 2026

(54) METHOD TO REMOVE AN ISOLATION LAYER ON THE CORNER BETWEEN THE SEMICONDUCTOR LIGHT EMITTING DEVICE TO THE GROWTH SUBSTRATE

(71) Applicants: SemiLEDs Corporation, Chu-Nan (TW); Shin-Etsu Chemical Co., Ltd., Tokyo (JP)

(72) Inventors: Chen-Fu Chu, Hsinchu City (TW); Shih-Kai Chan, Miaoli County (TW); Yi-Feng Shih, Miaoli County (TW); Trung Tri Doan, Hsinchu County (TW); David Trung Doan, Hsinchu County (TW); Yoshinori Ogawa, Kanagawa (JP); Kazunori Kondo, Gunma (JP); Toshiyuki Ozai, Gunma (JP); Nobuaki Matsumoto, Gunma (JP); Taichi Kitagawa, Gunma (JP)

(73) Assignees: SemiLEDs Corporation, Chu-Nan (TW); Shin-Etsu Chemical Co., Ltd., Tokyo (JP)

( * ) Notice: Subject to any disclaimer, the term of this patent is extended or adjusted under 35 U.S.C. 154(b) by 911 days.

(21) Appl. No.: 17/673,234

(22) Filed: Feb. 16, 2022

(65) Prior Publication Data

US 2022/0320366 A1 Oct. 6, 2022

Related U.S. Application Data

(60) Provisional application No. 63/168,341, filed on Mar. 31, 2021.

(51) Int. Cl.

*H10H 20/01* (2025.01)
*H10H 20/812* (2025.01)
*H10H 20/84* (2025.01)

(52) U.S. Cl.

CPC .......... *H10H 20/018* (2025.01); *H10H 20/84* (2025.01); *H10H 20/01335* (2025.01); *H10H 20/034* (2025.01); *H10H 20/812* (2025.01)

(58) Field of Classification Search

CPC ............. H01L 33/44; H01L 2933/0025; H01L 33/007; H01L 33/06; H01L 33/0093;

(Continued)

(56) References Cited

U.S. PATENT DOCUMENTS

| | | | | |
|---|---|---|---|---|
| 8,334,152 B2 * | 12/2012 | Speier | H01L 33/0093 | 438/26 |
| 2002/0096994 A1 * | 7/2002 | Iwafuchi | H01L 21/6835 | 257/E27.111 |

(Continued)

FOREIGN PATENT DOCUMENTS

| | | | |
|---|---|---|---|
| CN | 116544322 A * | 8/2023 | H10H 20/01 |
| EP | 2390926 A2 * | 11/2011 | H01L 33/0079 |

(Continued)

OTHER PUBLICATIONS

Application No. 22 16 4554, Extended European Search Report, Aug. 31, 2022, pp. 1-8.

*Primary Examiner* — Eva Y Montalvo
(74) *Attorney, Agent, or Firm* — Stephen A Gratton

(57) ABSTRACT

A method for fabricating semiconductor light emitting devices (LEDs) includes forming a plurality of light emitting diode (LED) structures having sidewall P-N junctions on a growth substrate, and forming an isolation layer on the light emitting diode (LED) structures having corners at intersections of the epitaxial structures with the growth substrate. The method also includes forming an etchable covering channel layer on the isolation layer, forming a patterning protection layer on the covering channel layer, forming etching channels in the covering channel layer using a first etching process, and removing the corners of the isolation (Continued)

layer by etching the isolation layer using a second etching process. Following the second etching process the isolation layer covers the sidewall P-N junctions. The method can also include bonding the growth substrate to a carrier and separating the growth substrate from the light emitting diode (LED) structures using a laser lift off (LLO) process.

4 Claims, 39 Drawing Sheets

(58) Field of Classification Search
CPC ....... H01L 2933/0008; H01L 21/76852; H01L 33/20; H01L 33/62; H01L 33/405; H10H 20/018
See application file for complete search history.

(56) References Cited

U.S. PATENT DOCUMENTS

| | | | | |
|---|---|---|---|---|
| 2004/0235210 | A1* | 11/2004 | Tamura | H01L 21/2007 438/22 |
| 2006/0105542 | A1* | 5/2006 | Yoo | H01L 21/32136 438/455 |
| 2009/0200568 | A1* | 8/2009 | Horie | H10H 20/84 438/34 |
| 2010/0276726 | A1 | 11/2010 | Cho et al. | |
| 2013/0130440 | A1* | 5/2013 | Hu | H01L 24/95 438/107 |
| 2014/0030830 | A1* | 1/2014 | Lee | H10K 50/854 438/29 |
| 2016/0197232 | A1* | 7/2016 | Bour | H01L 33/06 257/13 |
| 2017/0330857 | A1* | 11/2017 | Zou | H01L 24/81 |
| 2017/0373228 | A1* | 12/2017 | Chang | H01L 33/44 |
| 2018/0158806 | A1* | 6/2018 | Lai | H01L 24/97 |
| 2018/0166429 | A1* | 6/2018 | Chong | H01L 27/15 |
| 2019/0165214 | A1* | 5/2019 | Hsu | H01L 33/005 |
| 2021/0066541 | A1 | 3/2021 | Chu et al. | |
| 2021/0095391 | A1* | 4/2021 | Ghyselen | C30B 33/06 |
| 2022/0013698 | A1* | 1/2022 | Bower | H01L 25/0753 |
| 2022/0310884 | A1* | 9/2022 | Do | H01L 25/0753 |

FOREIGN PATENT DOCUMENTS

| | | | |
|---|---|---|---|
| JP | 2007-324586 | 12/2007 | |
| KR | 10-2012-0059910 A | 6/2012 | |
| KR | 20150073526 A * | 7/2015 | H01L 33/0093 |

* cited by examiner

METHOD TO REMOVE AN ISOLATION LAYER ON THE CORNER BETWEEN THE SEMICONDUCTOR LIGHT EMITTING DEVICE TO THE GROWTH SUBSTRATE

CROSS REFERENCE TO RELATED APPLICATION

This application claims priority from U.S. Provisional No. 63/168,341, filed Mar. 31, 2021, which is incorporated herein by reference.

BACKGROUND

This disclosure relates to the fabrication of semiconductor light emitting devices (LEDs) and particularly to methods for fabricating semiconductor light emitting devices (LEDs) in which a corner isolation layer on a growth substrate is formed and removed.

In the fabrication of semiconductor light emitting devices (LEDs), epitaxial structures can be formed using a growth substrate, such as a wafer comprised of a sapphire substrate. An exemplary (LED) epitaxial structure can include an undoped GaN layer, an n-type GaN layer, a single or multiple quantum well layer and a p-type GaN layer formed on the wafer. Light emitting device (LED) chips can be formed on the wafer by selectively removing layers of the (LED) epitaxial structure and exposing the sapphire substrate. For example, the sapphire substrate can be exposed in street regions of the wafer in a selected pattern to isolate each light emitting device (LED). For semiconductor light emitting device (LED) chips having a polygonal outline, each (LED) chip can be spatially separated from adjacent (LED) chips by street regions having a criss-cross pattern.

The present disclosure is directed to fabrication methods for semiconductor light emitting devices (LEDs) in which an isolation layer is formed on an epitaxial structure and selectively removed in a corner of the epitaxial structure proximate to a growth substrate. The present disclosure also enables novel semiconductor light emitting devices (LEDs) fabricated using the method.

SUMMARY

A method for fabricating semiconductor light emitting devices (LEDs) includes the step of forming a plurality of light emitting diode (LED) structures on a growth substrate. The light emitting diode (LED) structures include epitaxial structures with sidewalls having sidewall P-N junctions. In illustrative embodiments, the light emitting diode (LED) structures include dual pad light emitting diode (LED) structures and vertical light emitting diode (VLED) structures in chip form. In addition, the epitaxial structures can include an undoped layer (e.g., u-GaN), an n-type layer (e.g., n-GaN), active layers (e.g., SQW or MQW) and a p-type layer (e.g., p-GaN). In some embodiments, the epitaxial structures can include mesa surround structures for recessing the sidewall P-N junctions.

The method also includes the step of forming an isolation layer on the light emitting diode (LED) structures including on the sidewall P-N junctions. The isolation layer includes corners at the intersections of the epitaxial structures with the growth substrate. In an illustrative embodiment, the growth substrate comprises a wafer containing a plurality of light emitting diode (LED) structures, and having streets that separate the individual light emitting diode (LED) structures. The isolation layer can be formed on the light emitting diode (LED) structures to a uniform thickness using a conformable deposition process, and can either cover the streets or leave the streets open.

Following forming of the isolation layer, an etchable covering channel layer can be formed on the isolation layer. The covering channel layer can comprise an etchable material such as a metal, or an oxide.

Following forming of the covering channel layer, a patterning protection layer can be formed on the covering channel layer. The patterning protection layer can comprise a patternable material such as photoresist, having openings aligned with the corners of the isolation layer.

Following forming of the patterning protection layer, etching channels can be formed in the covering channel layer using a first etching process, in which an etchant passes through the openings in the patterning protection layer to etch away portions of the covering channel layer. The etching channels are located on the corners and can be shaped and sized to surround the corners for removal by a second chemical etching step. By way of example, the covering channel layer can comprise a metal and the first etching process comprises a wet chemical etching process.

Following forming of the etching channels, the corners of the isolation layer can be removed by etching the isolation layer using a second etching process. By way of example, the isolation layer can comprise an oxide (e.g., $SiO_2$) and the second etching process comprises a BOE etch. During this step the isolation layer is only removed at the corners leaving the isolation layer at the sidewall P-N junction intact. In an illustrative embodiment, the etching channels are formed such that the isolation layer only isolates the sidewall of the p-type layer, the sidewall of the active layers, and a portion of the sidewall of the n-type layer.

Following etching of the isolation layer, the covering channel layer and the patterning protection layer can be removed. Depending on the materials, these layers can be removed using techniques that are known in the art.

The method can also include a step of bonding the growth substrate to a carrier having an elastic polymer material thereon. In an illustrative embodiment, the bonding step can be performed by flip chip bonding the light emitting diode (LED) structures to the carrier. The method can also include a laser lift off (LLO) step wherein the growth substrate is separated from the light emitting diode (LED) structures using a laser lift off (LLO) process.

In an alternate embodiment of the method, a covering channel layer is not formed on the isolation layer. Rather, a patterning protection layer is formed directly on the isolation layer. Then, a first etching process removes the isolation layer in the streets of the growth substrate, and a second etching process removes the corners of the isolation layer and forms undercut sidewall structures on the sidewalls of the epitaxial structures.

A semiconductor light emitting device (LED) fabricated using the method, or the alternate embodiment method, includes the isolation layer covering the sidewall P-N junction, the sidewall of the p-type layer, the sidewall of the active layers, and a portion of the sidewall of the n-type layer leaving the undoped layer exposed.

DETAILED DESCRIPTION

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
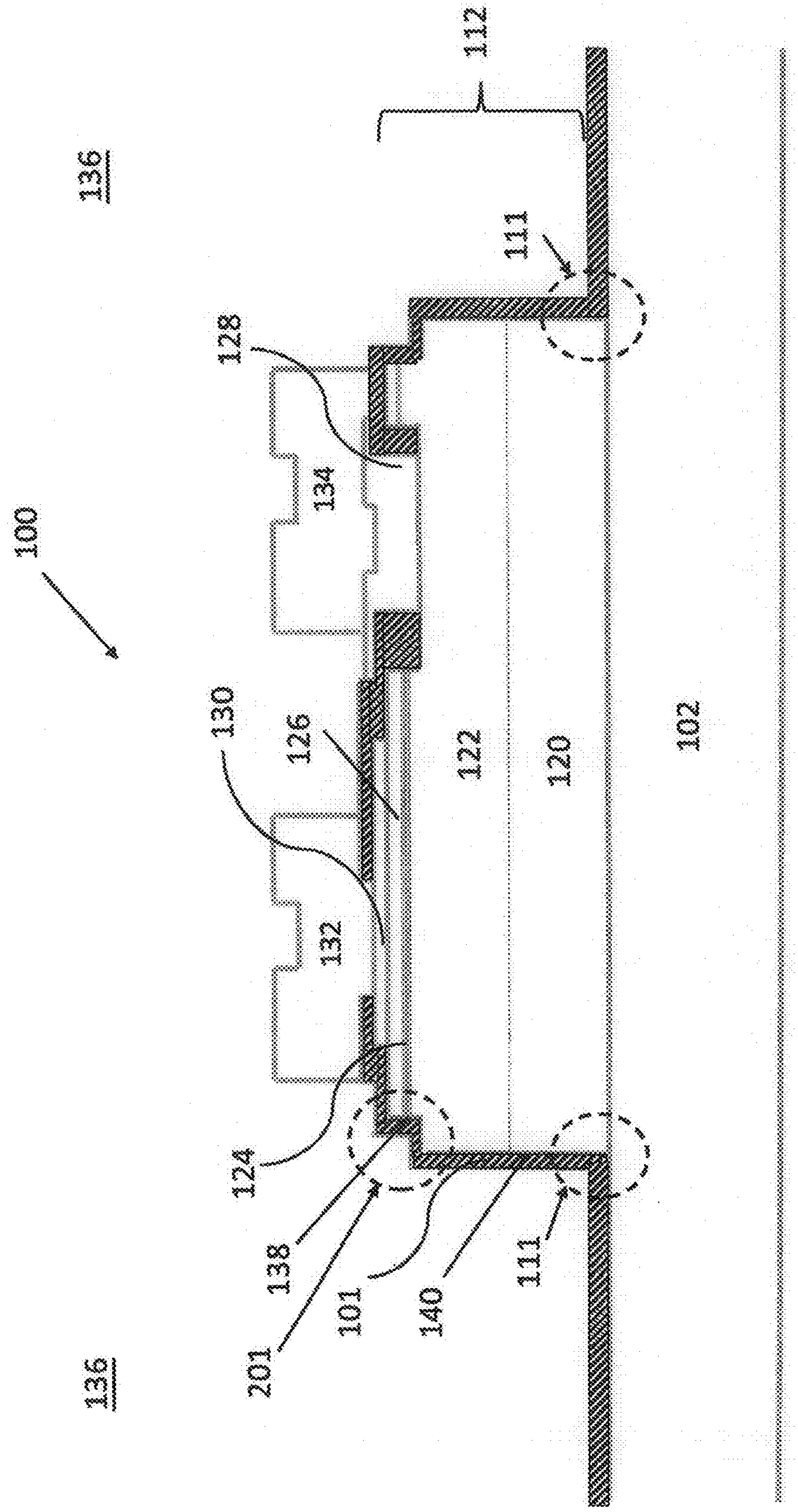
FIG. 1 is an enlarged schematic cross sectional view of a dual pad semiconductor light emitting device (LED) structure shown after forming of an isolation layer having a corner prior to a laser lift off (LLO) step of the method.

Referring to FIG. 1, initial steps in the method for fabricating semiconductor light emitting devices (LEDs) are illustrated. The method includes the step of forming a plurality of light emitting diode (LED) structures 100 on a growth substrate 102 and forming an isolation layer 101 on the light emitting diode (LED) structures 100 having corners 111 proximate to the growth substrate 102. Ideally, the corners 111 have a right angle but depending on the deposition process the angle of the corners 111 may be greater than or less than 90 degrees.

In an illustrative embodiment, the growth substrate 102 can comprise sapphire, and the light emitting diode (LED) structures 100 can comprise dual pad (LED) chips. Each light emitting diode (LED) structure 100 includes an undoped layer 120, such as u-GaN, an n-type layer 122, such as n-GaN, active layers 124, such as SQW or MQW, a p-type layer 126, such as p-GaN, an n-type conductive layer 128, such as a metal, a p-type conductive layer 130, such as a metal, a p-pad 132, such as a metal, and an n-pad 134, such as a metal.

Each light emitting diode (LED) structure 100 can be configured as a direct bandgap compound semiconductor light emitting diode (LED) structure formed using semiconductor fabrication processes. For example, the epitaxial structure 112 can be grown on the growth substrate 102 using semiconductor processes that include the growth of the undoped layer 120 (e.g., u-GaN layer), the n-type layer 122 (e.g., Si doped GaN layer), the active layers 124 (e.g. multiple quantum wells), and the p-type layer 126 (e.g. Mg doped GaN layer). However, these materials are merely exemplary, and the epitaxial structure 112 can be formed of other direct bandgap compound semiconductor light emitting diode materials grown on the growth substrate 102. For example, the emitting wavelength of semiconductor light can be determined by the energy bandgap of a direct bandgap semiconductor compound. Different direct energy bandgaps of the semiconductor light emitting material can be selected from III-V compound semiconductors, such as $In_xGa_{1-x}N$, GaN, $Al_xGa_{1-x}N$, $In_xGa_{1-x}As$, InGaP, GaAs, GaAsP, InP, $(Al_xGa_{1-x})_yIn_{1-y}P$, GaP.

The isolation layer 101 can comprise a continuous layer formed of a dielectric material, such as $SiO_2$, $Si_3N_4$, $Al_2O_3$ or $TiO_2$ formed to a uniform thickness using a suitable deposition process such as CVD, PECVD, spin-on or deposition through a nozzle. A representative thickness of the isolation layer 101 can be from 2000 A to 500 μm. As shown in FIG. 1, the isolation layer 101 can be deposited on a top portion of the p-type layer 126, and on the sidewalls of the p-type layer 126. In addition, the isolation layer 101 can be deposited on the sidewalls of the active layer 124, on the sidewalls of the n-type layer 122, on the sidewalls of the undoped layer 120 and on a portion of the exposed growth substrate 102 in the street region 136. Also note that the corner 111 of the isolation layer 101 is located between the undoped layer 120 of the sidewall 140 of the light emitting diode (LED) structure 100 and the surface of the growth substrate 102. In addition, the isolation layer 101 is conformally deposited on the corner 111 with a right angle, and can be deposited on either portion of the street regions 136 or on the entire street regions 136.

As also shown in FIG. 1, a mesa surround structure 201 can be formed to provide a spacing of the sidewall P-N junctions 138 away from the sidewalls 140 of the light emitting diode (LED) structure 100. This spacing functions to extend the length of the isolation layer 101. With the mesa surround structure 201, the isolation layer 101 extends from vertical connections at the sidewalls 140 of the light emitting diode (LED) structures 100 to a horizontal connection at the mesa surround structures 201 and then turns to the vertical connection at the sidewall P-N junctions 138. The different directions of the isolation layer 101 can be provided using a different speed/rate of chemical etching.

Figure 2:
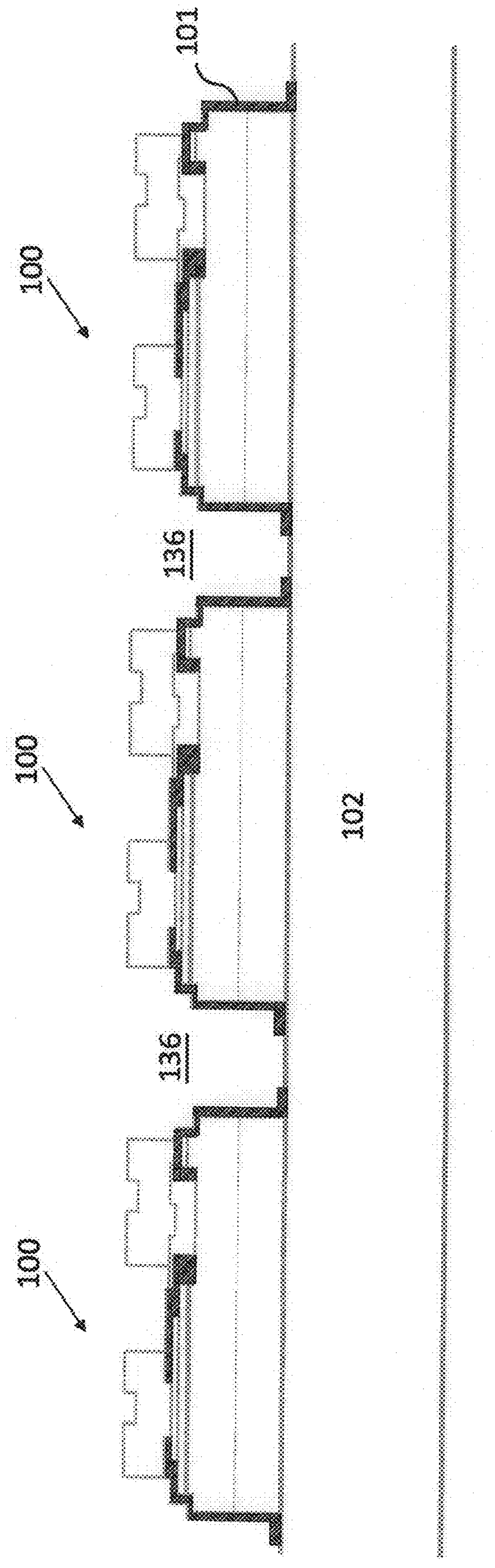
FIG. 2 is an enlarged schematic cross sectional view of a plurality of dual pad semiconductor light emitting device (LED) structures shown on a growth substrate with an isolation layer not extending into the street regions thereof.
Figure 2A:
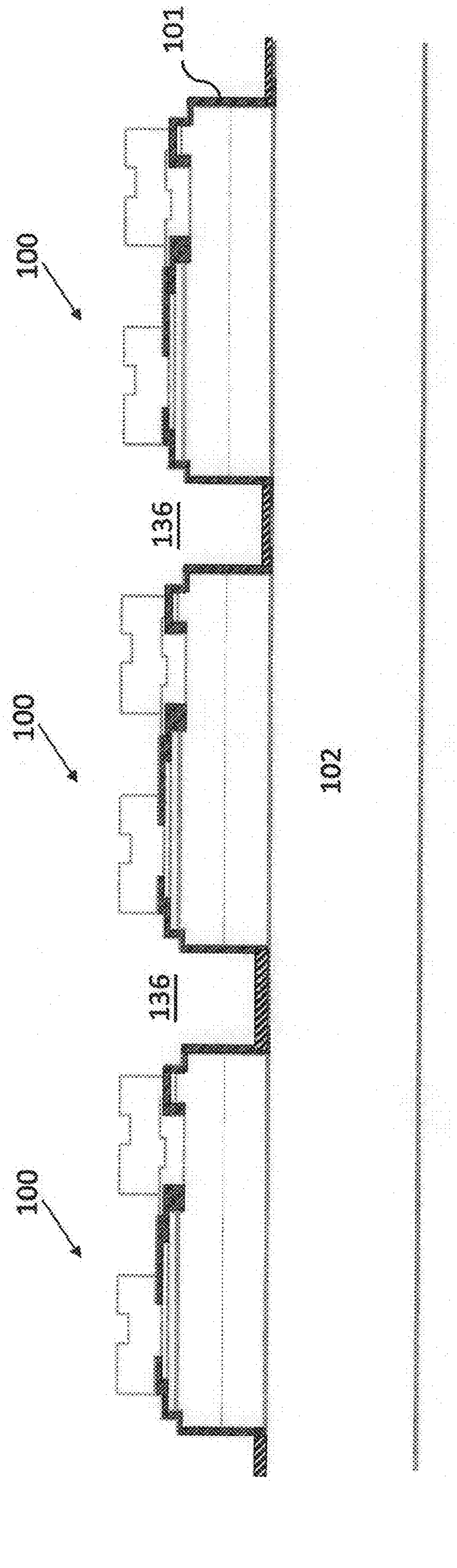
FIG. 2A is an enlarged schematic cross sectional view of a plurality of dual pad semiconductor light emitting device (LED) structures shown on a growth substrate with an isolation layer extending into the street regions thereof.

As shown in FIG. 2, the growth substrate 102 can include a plurality of light emitting diode (LED) structures 100 separated by the street regions 136. FIGS. 2 and 2A illustrate two different configurations for the isolation layer 101 on the growth substrate 102. In FIG. 2, the isolation layer 101 does not continue into the street regions 136. In FIG. 2A, the isolation layer 101 continues into the street regions 136.

The light emitting diode (LED) structures 100 shown in FIG. 1, FIG. 2 and FIG. 2A, have the configuration of conventional flip chip light emitting diodes (FCLEDs). In each light emitting diode (LED) structure 100, the p-type conductive layer 130 can be combined by using multiple conductive layers such as a p-type ohmic contact layer to the p-type layer 126 followed by additional p-metal layers as required. For example, a p-type ohmic contact layer can comprise ITO, Ni, Ag, Au, Pt, Pd or alloys of these metals. The p-type conductive layer 130 can comprise Cr, Ni, Al, Au, Cu, Ti, W, TiN or alloys of these metals. The n-type conductive layer 128 can comprise Cr, Al, Ti, Ni, Au or alloys of these metals. The p-pad 132 can be electrically conductive to the p-type layer 126 and the n-pad 134 can be electrically conductive to the n-type layer 122.

Figure 3:
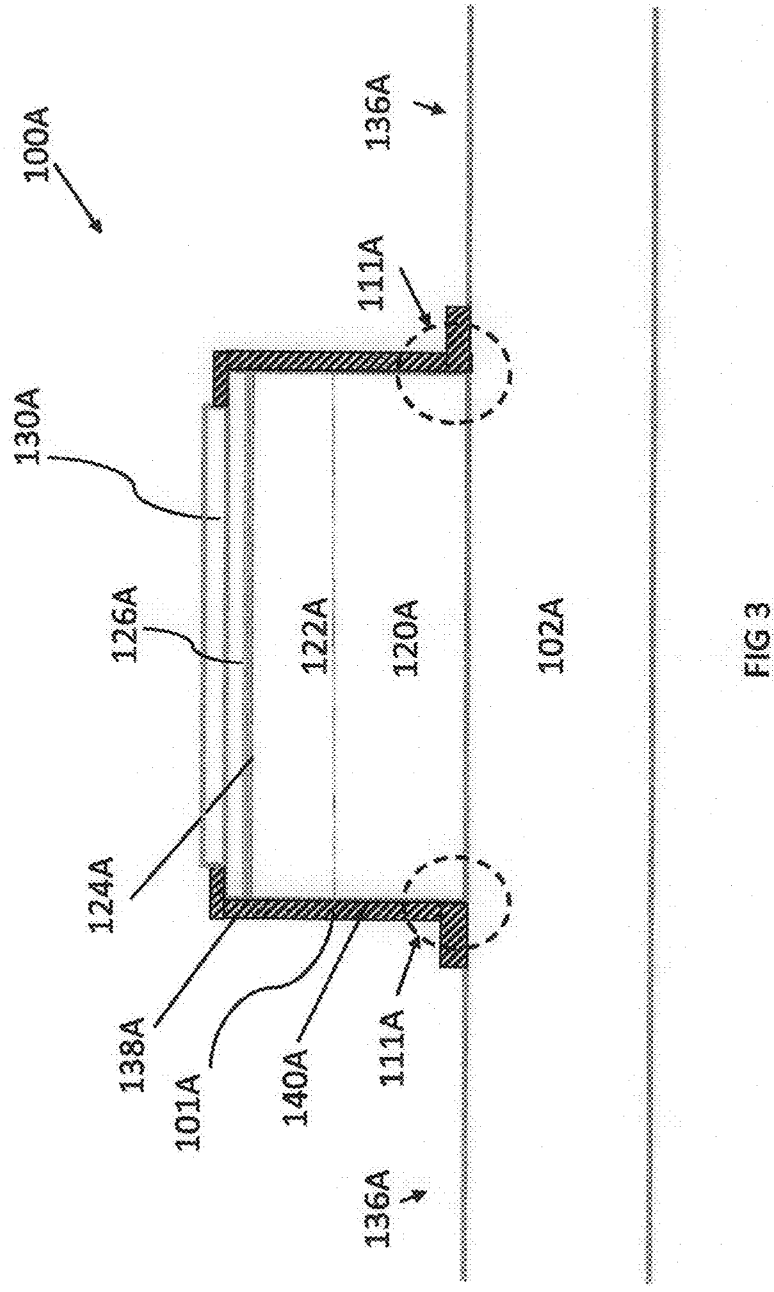
FIG. 3 is an enlarged schematic cross sectional view of a vertical light emitting diode (VLED) structure shown after forming of an isolation layer having a corner prior to a laser lift off (LLO) step of the method.

Referring to FIG. 3, a vertical light emitting diode (VLED) structure 100A has the configuration of a vertical light emitting diode (VLED) chip. The vertical light emitting diode (VLED) structure 100A includes an undoped layer 120A, an n-type layer 122A, an active layer 124A, and a p-type layer 126A arranged substantially as shown. As before, in accordance with the present method, an isolation layer 101A having corners 111A has been formed on the p-type layer 126A, and on a portion of the growth substrate 102A, substantially as previously described. In the vertical light emitting diode (VLED) structure 100A of FIG. 3, the isolation layer 101A can also be formed on the sidewalls 140A of the vertical light emitting diode (VLED) structure 100A and on the sidewalls of the P-N junction 138A as well.

Figure 3A:
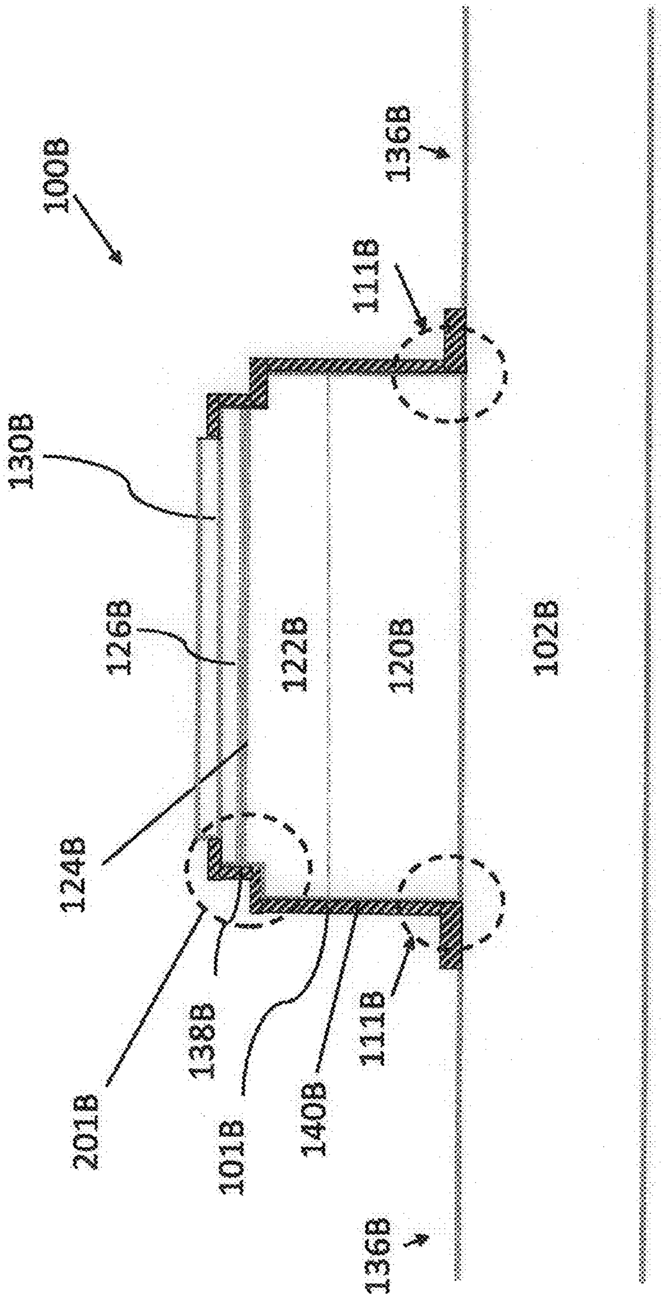
FIG. 3A is an enlarged schematic cross sectional view of a vertical light emitting diode (VLED) structure having a mesa surround structure shown after forming of an isolation layer having a corner prior to a laser lift off (LLO) step of the method.
Figure 4:
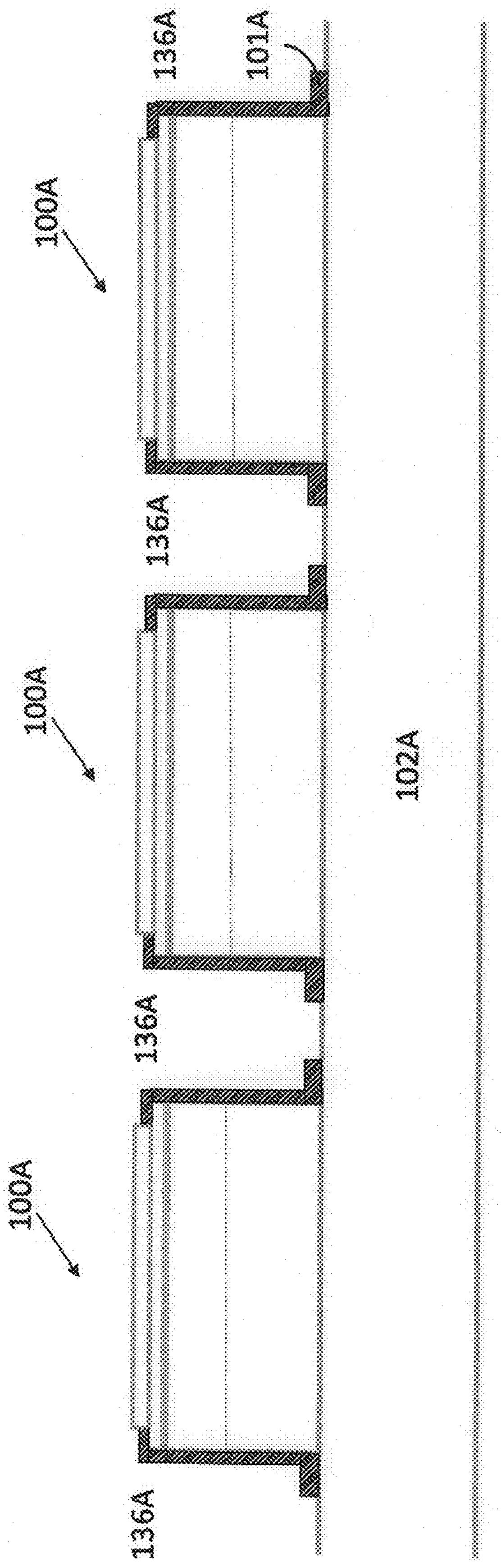
FIG. 4 is an enlarged schematic cross sectional view of a plurality of vertical light emitting diode (VLED) structures shown on a growth substrate with an isolation layer not extending into the street regions thereof.

Referring to FIG. 3A, a vertical light emitting diode (VLED) structure 100B has the configuration of a vertical light emitting diode (VLED) chip on a growth substrate 102B constructed substantially as previously described for vertical light emitting diode (VLED) structure 100A (FIG. 3). However, the vertical light emitting diode (VLED) structure 100B also includes a mesa surround structure 201B constructed substantially as previously described for mesa surround structure 201 (FIG. 1). With the mesa surround structures 201 (FIG. 1) and 201B (FIG. 3A), a sidewall P-N junction 138B is spaced away from the sidewalls 140B of the vertical light emitting diode (VLED) structure 100B. As before, an isolation layer 101B having a corner 111B has been formed on the sidewalls 140B of the VLED chip, on the mesa surround structure 201B and on the sidewall P-N junction 138B. In FIG. 3 and FIG. 3A, a p-type conductive layer 130A (FIG. 3), 130B (FIG. 3A) can comprise ITO, Ni, Ag, Au, Pt, Pd or alloys of these metals. In FIG. 4, a plurality of vertical light emitting diode (VLED) structures 100A have been formed on the growth substrate 102A, and the isolation layer 101A does not continue into the street regions 136A.

Figure 5:
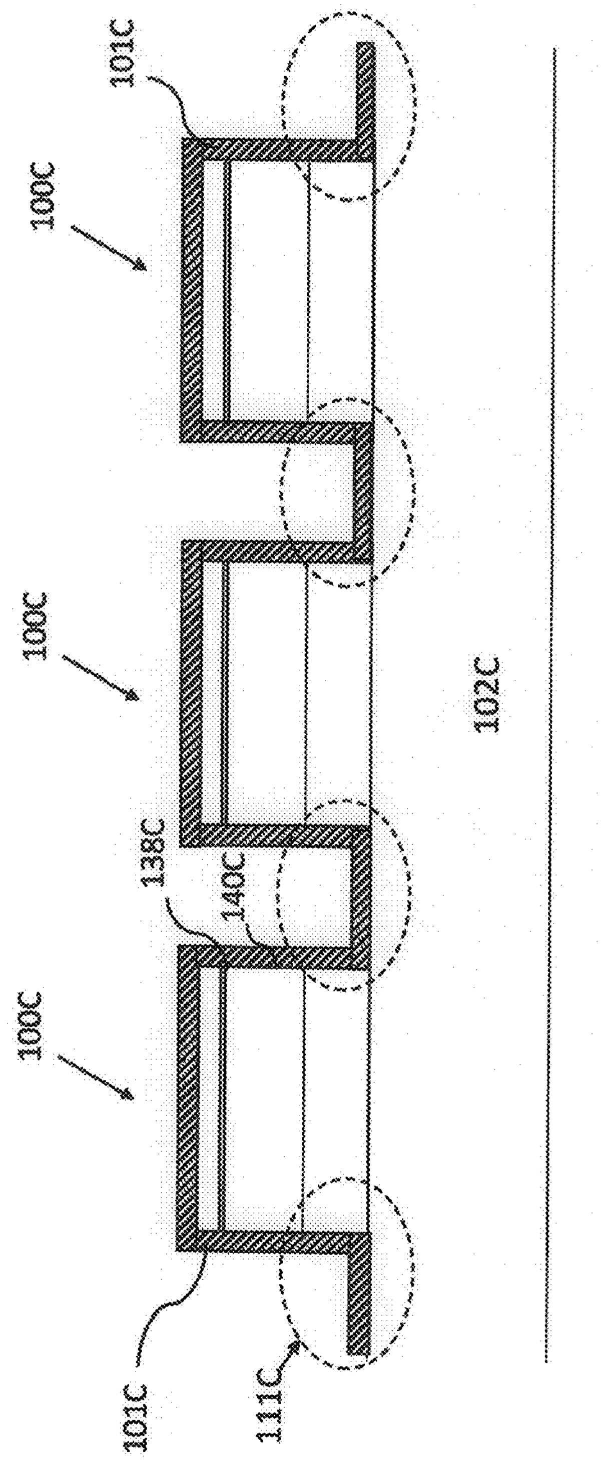
FIG. 5 is an enlarged schematic cross sectional view illustrating a step of the method of forming an isolation layer on a plurality of vertical light emitting diode (VLED) structures on a growth substrate.
Figure 5A:
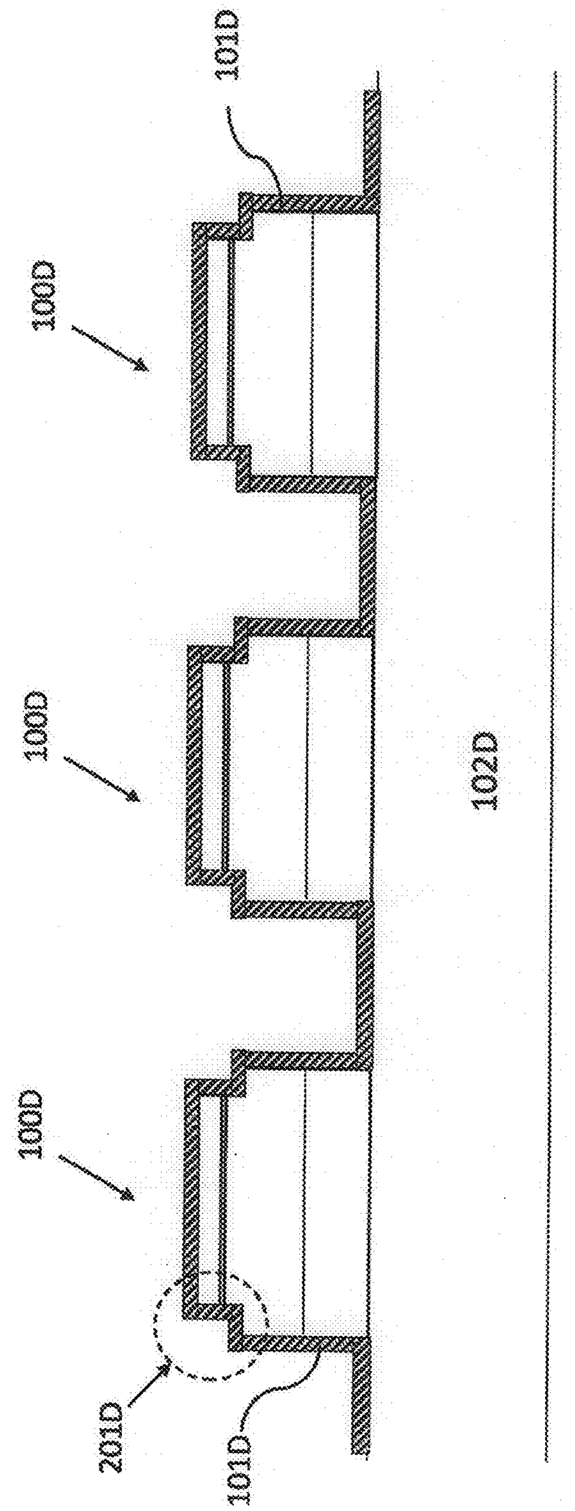
FIG. 5A is an enlarged schematic cross sectional view illustrating a step of the method of forming an isolation layer on a plurality of vertical light emitting diode (VLED) structures having mesa surround structures on a growth substrate.

Referring to FIGS. 5-10, further steps in the method for fabricating semiconductor light emitting devices (LEDs) are illustrated. In FIG. 5, an isolation layer 101C has been formed on a plurality of vertical light emitting diode (VLED) structures 100C on a growth substrate 102C and includes corners 111C on the intersection of the vertical light emitting diode (VLED) structures 100C and the growth substrate 102C substantially as previously described. FIG. 5A is another embodiment wherein an isolation layer 101D has been formed on a plurality of vertical light emitting diode (VLED) structures 100D with mesa surround structures 201D on a growth substrate 102D. The isolation layer 101C (FIG. 5) or isolation layer 101D (FIG. 5A) can be conformably formed on the vertical light emitting diode (VLED) structures 100C to a uniform thickness using a suitable deposition process such as CVD, PECVD, spin-on or deposition through a nozzle. As shown in FIG. 5, the isolation layer 101C covers the sidewalls 140C containing P-N sidewall junctions 138C and maintains the isolation of the vertical light emitting diode (VLED) structures 100D from one another on the growth substrate 102C.

Figure 6:
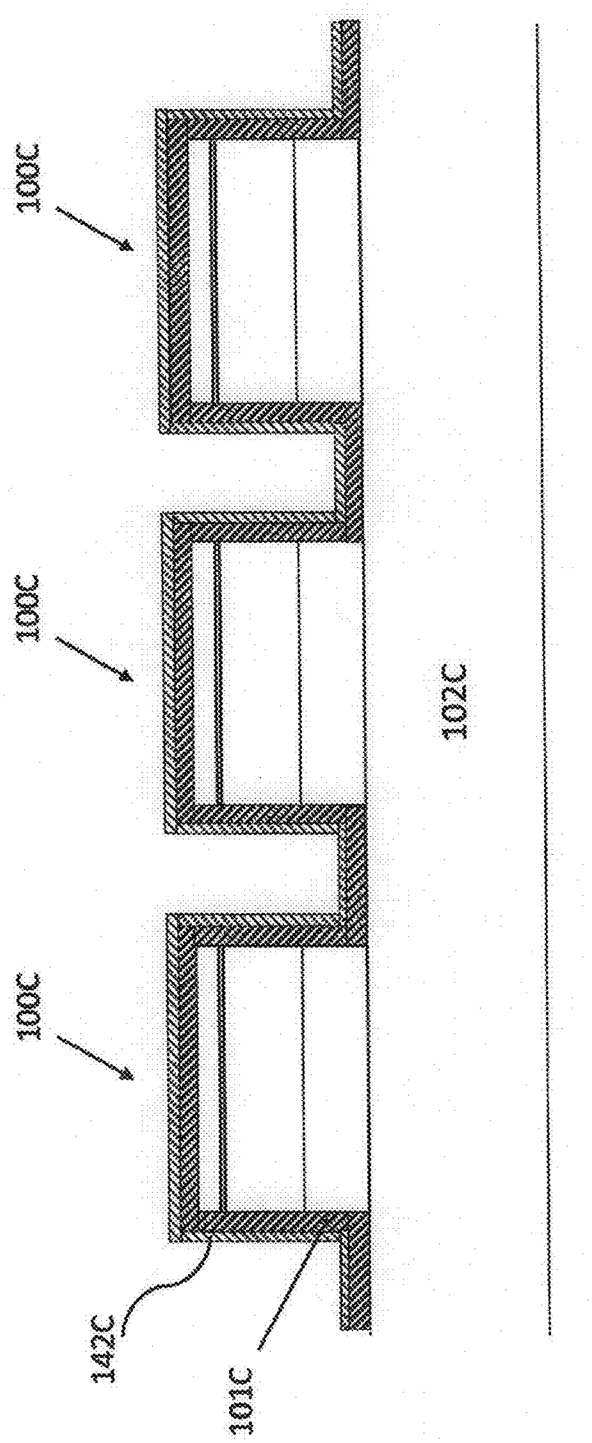
FIG. 6 is an enlarged schematic cross sectional view illustrating a step of the method of forming a covering channel layer on the isolation layer.

Referring to FIG. 6, following forming of the isolation layer 101C, an etchable covering channel layer 142C can be formed on the isolation layer 101C. The covering channel layer 142C can comprise an etchable material including a metal, such as Ti, or an oxide, such as $SiO_2$.

Figure 7:
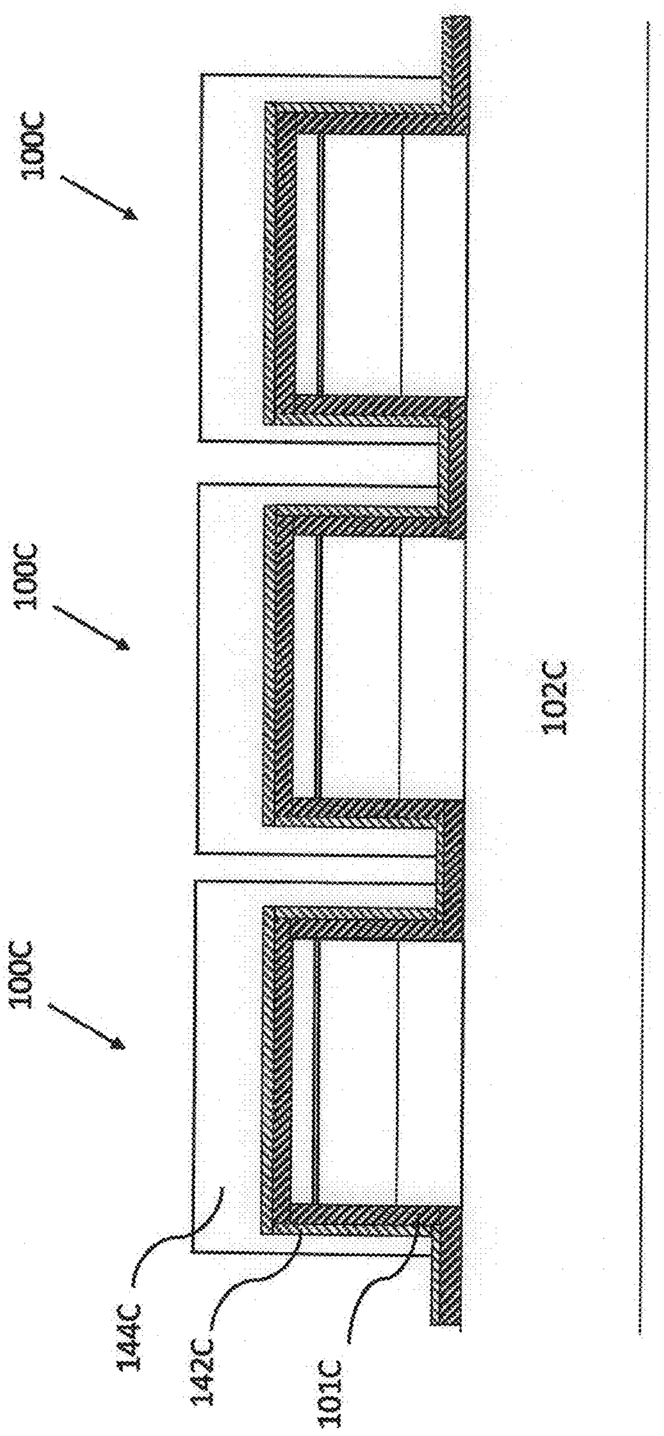
FIG. 7 is an enlarged schematic cross sectional view illustrating a step of the method of forming a patterning protection layer on the covering channel layer.

Referring to FIG. 7, following forming of the covering channel layer 142C, a patterning protection layer 144C can be formed on the covering channel layer 142C. The patterning protection layer 144C can comprise a patternable material such as photoresist.

Figure 8:
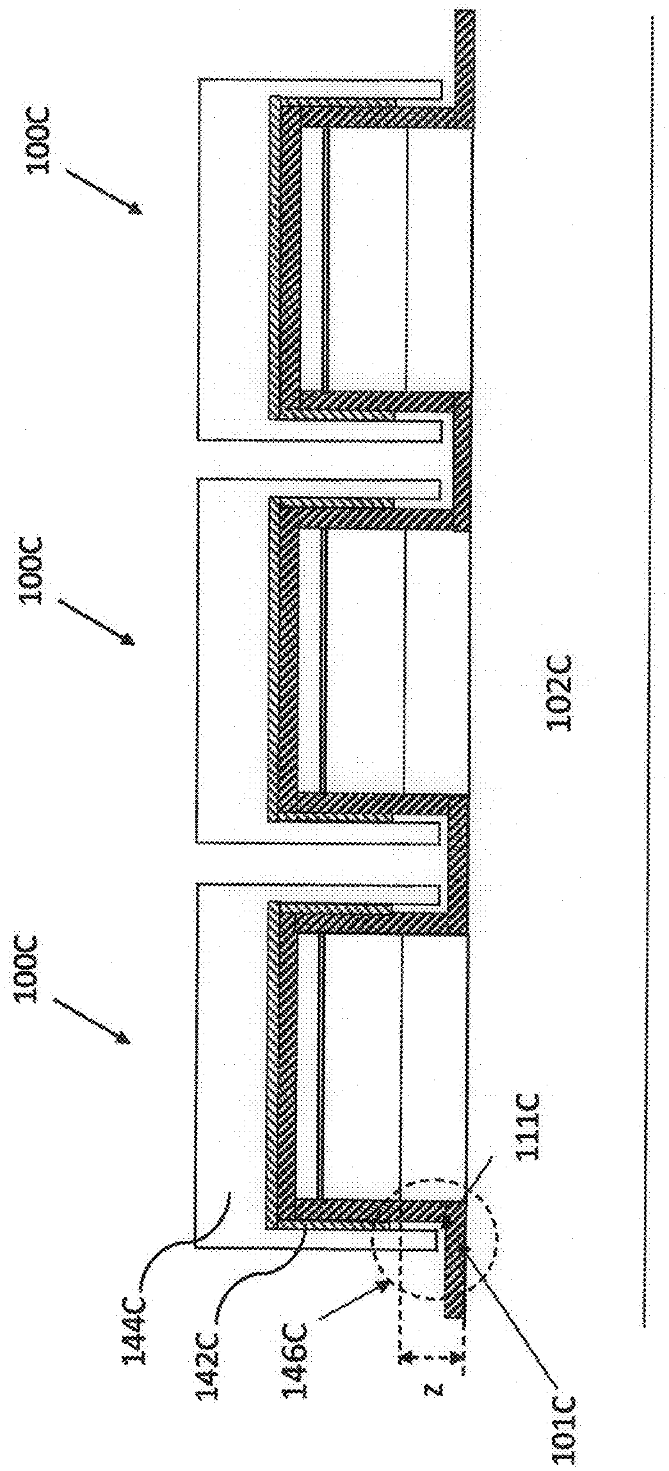
FIG. 8 is an enlarged schematic cross sectional view illustrating a step of the method of forming an etching channel using a first chemical etching process.

Referring to FIG. 8, following forming of the patterning protection layer 144C, etching channels 146C can be formed in the covering channel layer 142C using a first chemical etching process. The etching channels 146C are located on the corners 111C and can be shaped and sized with dimensions, such as a height z on the growth substrate 102C, to surround the corners 111C for removal by a second chemical etching step. The patterning protection layer 144C includes openings formed using photolithography that determine the location, shape and size of the etching channels 146C. In an exemplary embodiment, the first chemical etching process can be performed using an etcher chemical solution for metal to provide selective wet etching for removing portions of a covering channel layer 142C comprised of a metal (e.g., Ti).

Figure 9:
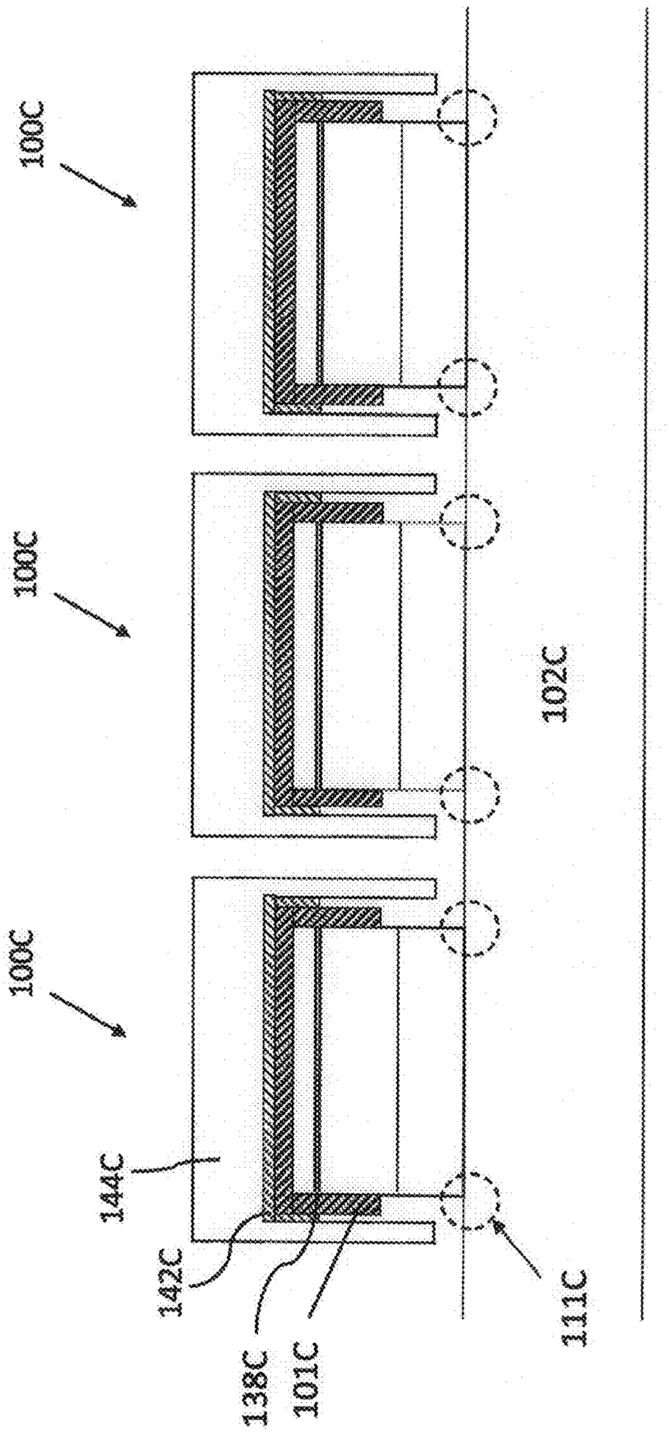
FIG. 9 is an enlarged schematic cross sectional view illustrating a step of the method of etching the isolation layer using a second chemical etching process.

Referring to FIG. 9, following forming of the etching channels 146C the corners 111C of the isolation layer 101C can be removed by etching the isolation layer 101C using a second chemical etching process. In an exemplary embodiment, the isolation layer 101C can comprise $SiO_2$ and the second chemical etching process can be performed using a BOE etch. Note that during this step the isolation layer 101C is only removed at the corner 111C leaving the isolation layer 101C covering the sidewall P-N junction 138C.

In another embodiment, the isolation layer 101C can comprise $Si_3N_4$ and the covering channel layer 142C can comprise $SiO_2$. For a BOE chemical etching, the etching rate of the $Si_3N_4$ is slower than that of the $SiO_2$ (e.g., etching $SiO_2$ 500 nm in BOE takes only a few seconds, but etching $Si_3N_4$ 500 nm in BOE needs a few minutes). Thus, for the first-time etching process, a $SiO_2$ covering channel layer 142C can be removed faster than that of the $Si_3N_4$ isolation layer 101C thus forming an etching channel 146C. By etching for a longer time in the same BOE solution, the $Si_3N_4$ isolation layer 101C at the corner 111C can be removed. Please note that the method functions to remove only the isolation layer 101C at the corner 111C, leaving the isolation layer 101C at the sidewall P-N junction 138C protected and unetched.

In embodiments, such as vertical light emitting diode (VLED) structure 100B (FIG. 3A) having the mesa surround structure 201B (FIG. 3A), and vertical light emitting diode (VLED) structures 100D (FIG. 5A) having mesa surround structures 201D (FIG. 5A), the mesa surround structures 201B (FIG. 3A) or 201D (FIG. 5A) function as structures to slow down the etching speed/rate. In these embodiments, the covering channel layer 142C (FIG. 7) and the isolation layer 101B (FIG. 3A) or 101D (FIG. 5A) have a turn direction of etching from a vertical direction to a horizontal direction. The mesa surround structures 201B (FIG. 3A) or 201D (FIG. 5A) take advantage of the concept of the etching rate for a target etching layer having different etching speed/rate at different directions. For some applications, the mesa surround structures 201B (FIG. 3A) or 201D (FIG. 5A) can be fabricated as multiple mesas structures (similar to be stairs) if needed, as a geometrical control of the etching conditions.

Figure 10:
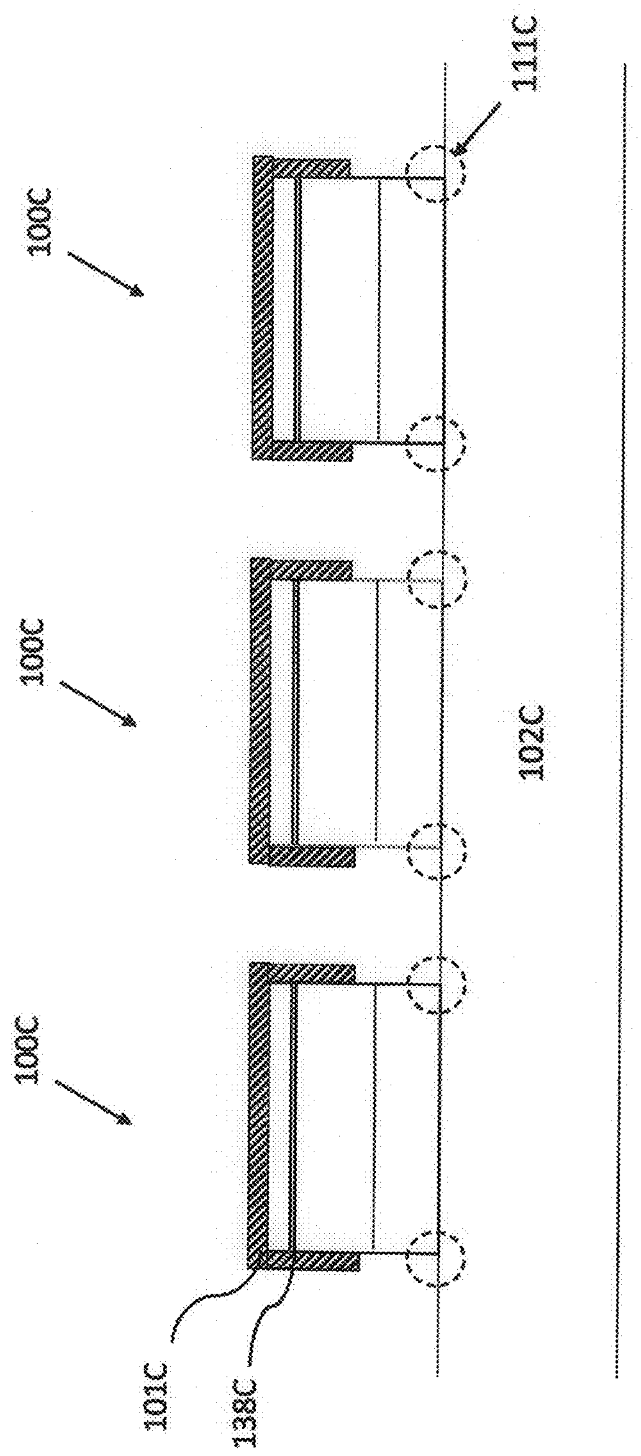
FIG. 10 is an enlarged schematic cross sectional view illustrating a step of the method of removing the covering channel layer and the patterning protection layer.

Referring to FIG. 10, following etching of the isolation layer 101C, the covering channel layer 142C and the patterning protection layer 144C can be removed. Depending on the materials, these layers can be removed using techniques that are known in the art.

Figure 11:
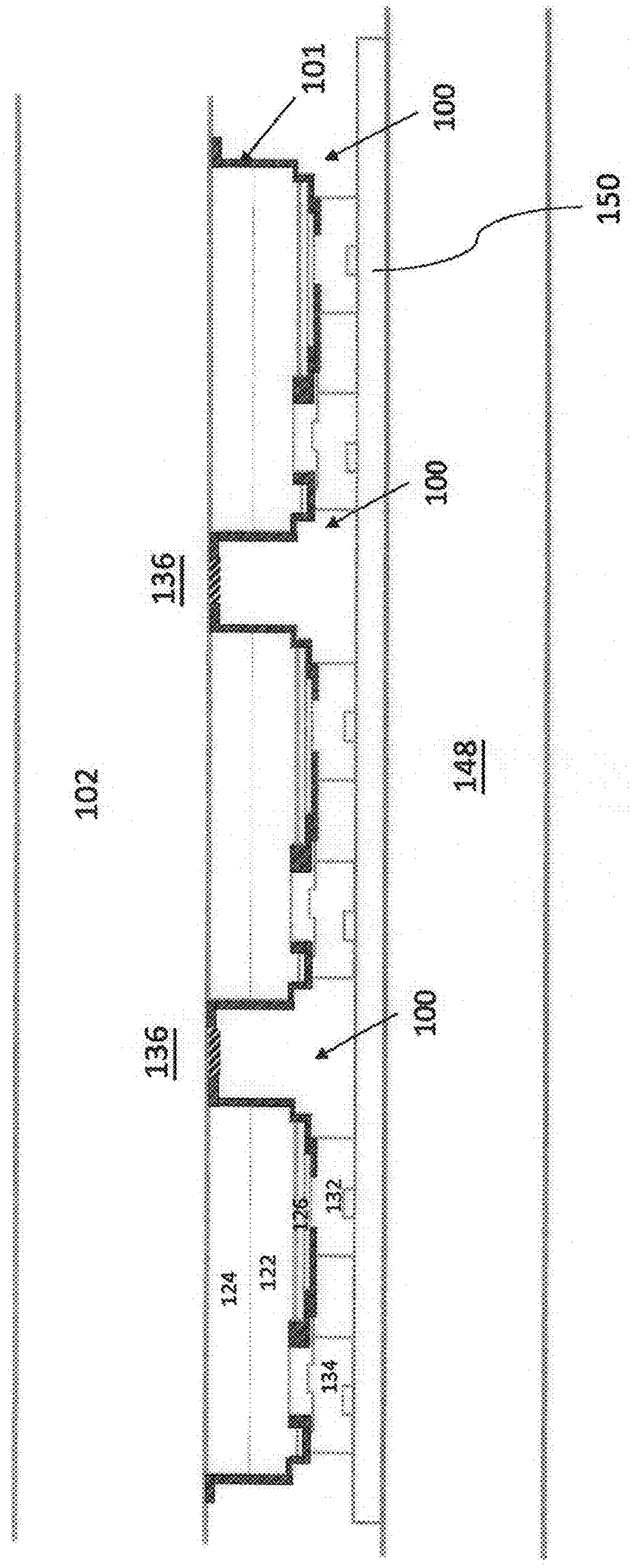
FIG. 11 is an enlarged schematic cross sectional view illustrating a step of the method of bonding the growth substrate to a carrier having an elastic polymer material thereon.

Referring to FIG. 11, the method can also include a step of bonding the growth substrate 102 to a carrier 148 having an elastic polymer material 150 thereon. The bonding step is part of a laser lift off (LLO) process to be further described. The bonding step can be performed by flip chip bonding the light emitting diode (LED) structures 100 to the carrier 148.

Figure 12:
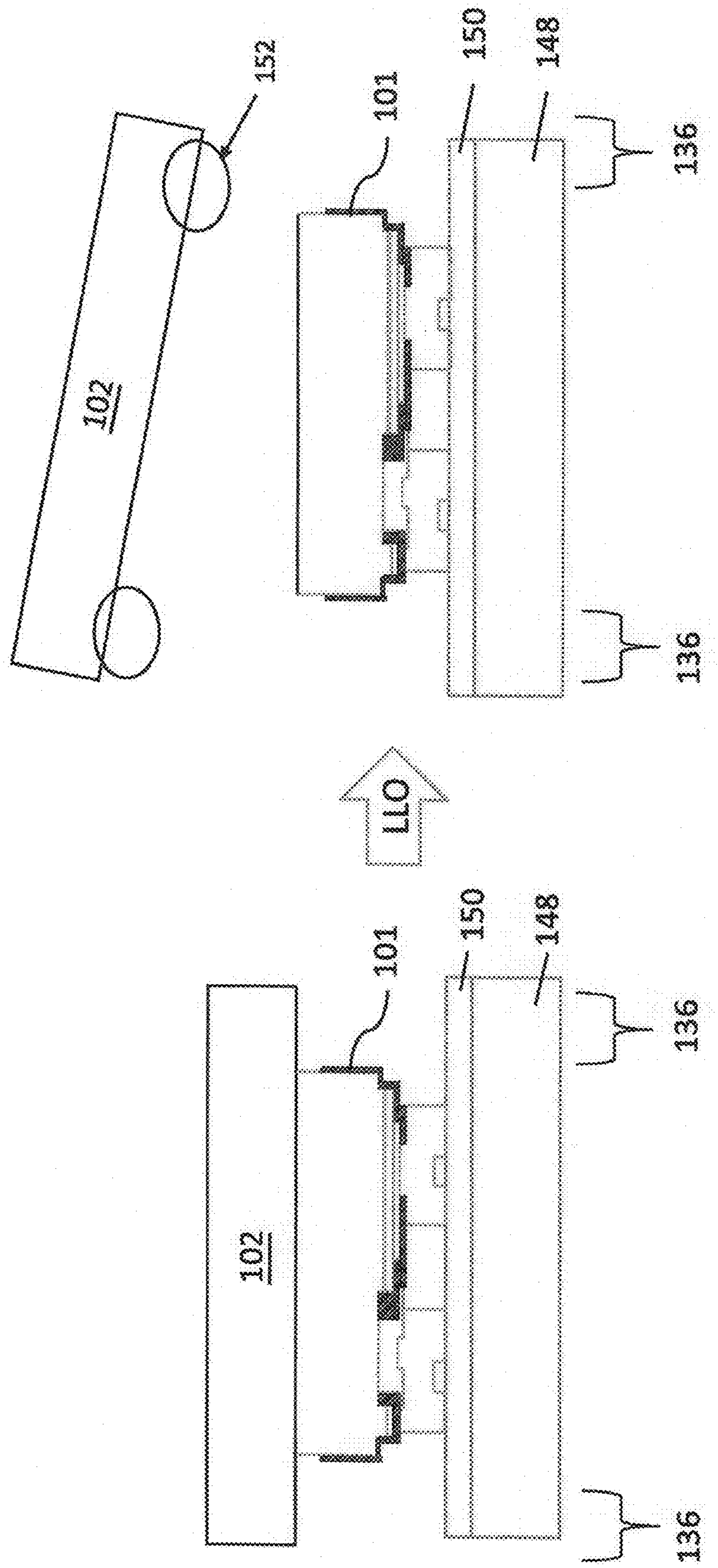
FIG. 12 is an enlarged schematic cross sectional view illustrating a laser lift off (LLO) step of the method wherein the growth substrate is separated from the dual pad semiconductor light emitting device (LED) structures.

Referring to FIG. 12, the method can also include a laser lift off (LLO) step wherein the growth substrate 102 is separated from the light emitting diode (LED) structures 100 using a laser lift off process. US Publication No.: US 2021/0066541 to Chu et al., which is incorporated herein by reference, discloses a laser lift off process (LLO), and the above described bonding step. In one embodiment, the corners 111 of the isolation layer 101 have been removed. The original isolation layer 101 on the corner areas 152 cannot be damaged to leave a partial isolation layer peel (not shown) on the growth substrate 102. In addition, the present (LLO) step transmits the light emitting diode (LED) structures 100 to the carrier 148 without damaging isolation layer 101 on the sidewall P-N junction 138 (FIG. 1). This produces robust light emitting diode (LED) structures 100 for different applications. In addition, the street regions 136 of the carrier 148 remain clean (no isolation residue).

Figure 13:
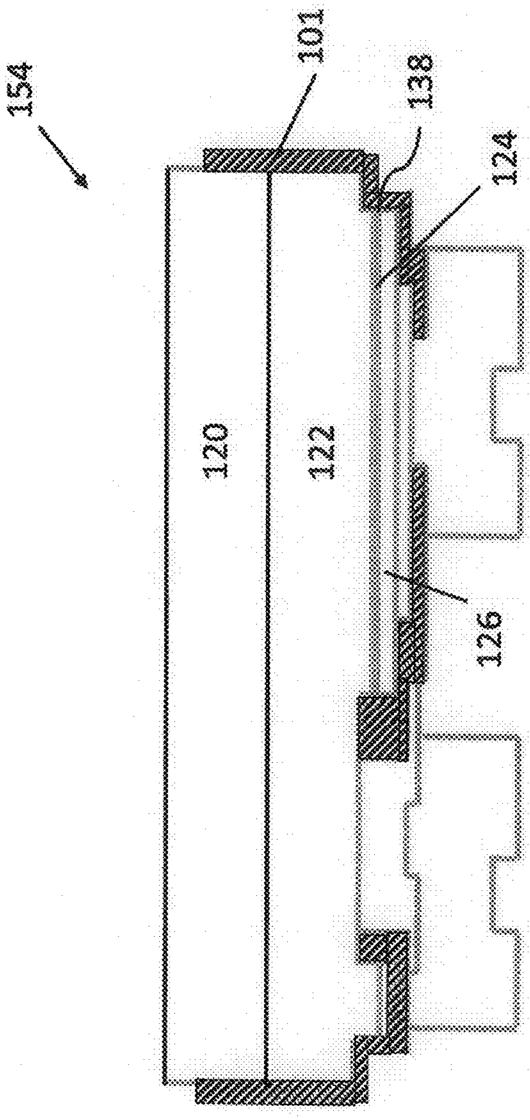
FIG. 13 is an enlarged schematic cross sectional view illustrating a semiconductor light emitting device (LED) fabricated using the method.

Referring to FIG. 13, a semiconductor light emitting device (LED) 154 fabricated using the method is illustrated. The semiconductor light emitting device (LED) 154 includes the isolation layer 101 covering the sidewall P-N junction 138. In addition, the isolation layer 101 covers a sidewall of the p-type layer 126 (FIG. 1), a sidewall of the active layers 124 (FIG. 1), and a portion of a sidewall of the n-type layer 122 (FIG. 1) leaving the undoped layer 120 (FIG. 1) exposed. In some cases, the isolation layer 101 covers a sidewall of the p-type layer 126, a sidewall of the active layers 124, a sidewall of the n-type layer 122 and a portion of the undoped layer 120, leaving the other portion of the undoped layer 120 exposed.

Figure 14:
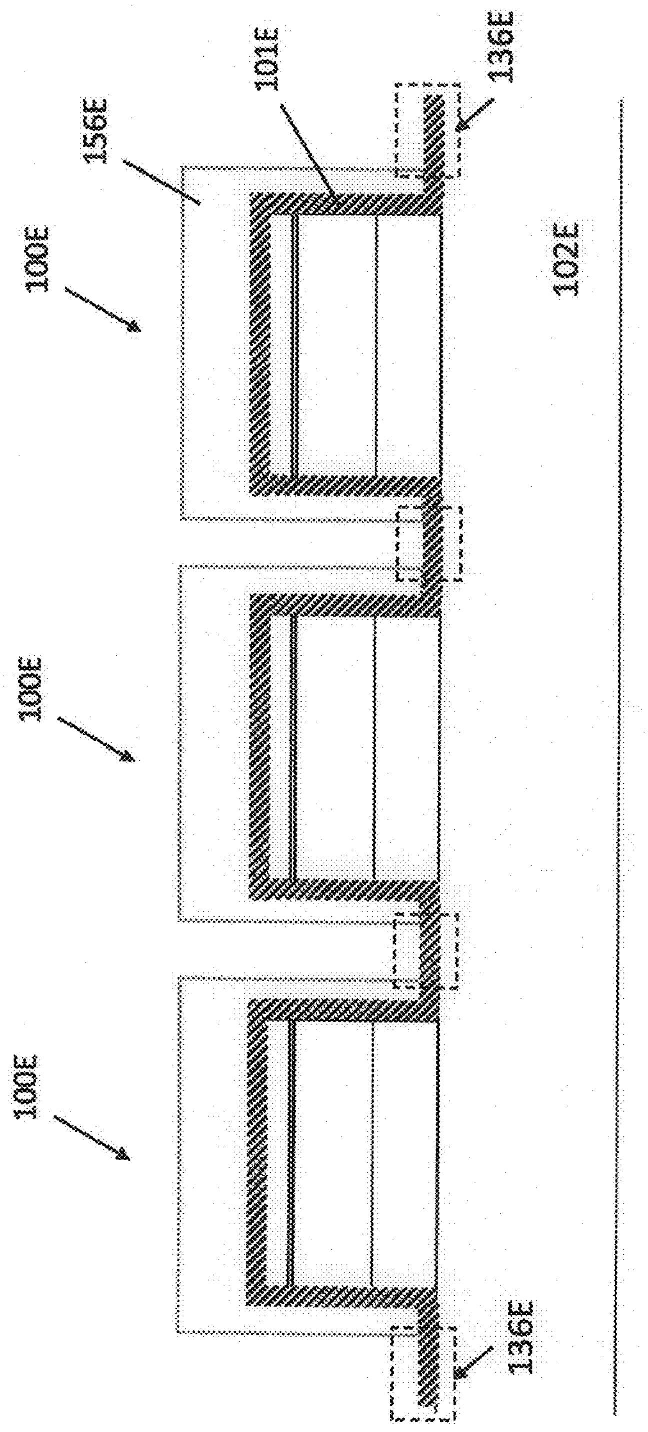
FIGS. 14-17 are enlarged schematic cross sectional views illustrating an alternate embodiment method for fabricating semiconductor light emitting devices (LEDs) in which a patterning protection layer can be deposited directly on an isolation layer and the isolation layer etched using a first etch process to remove material in the street regions and a second etch process to form undercut sidewall structures.
Figure 15:
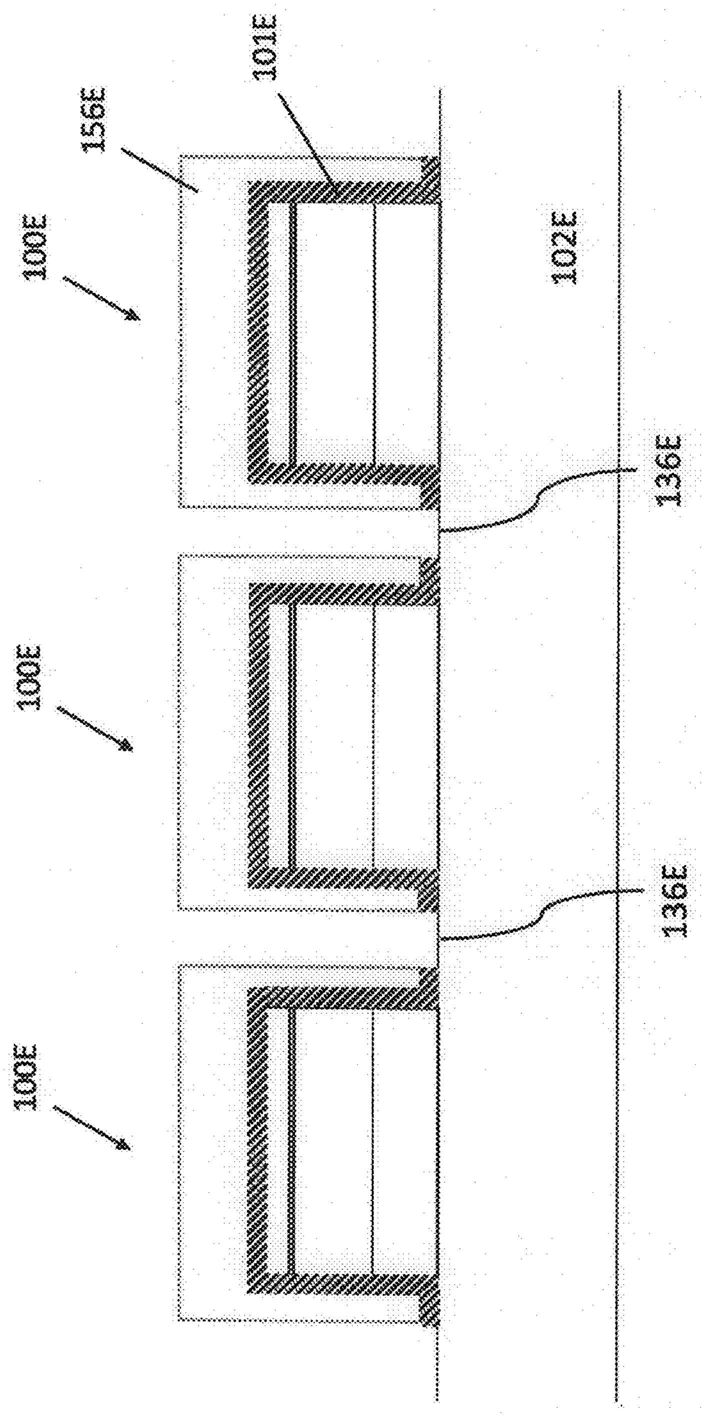
Figure 16:
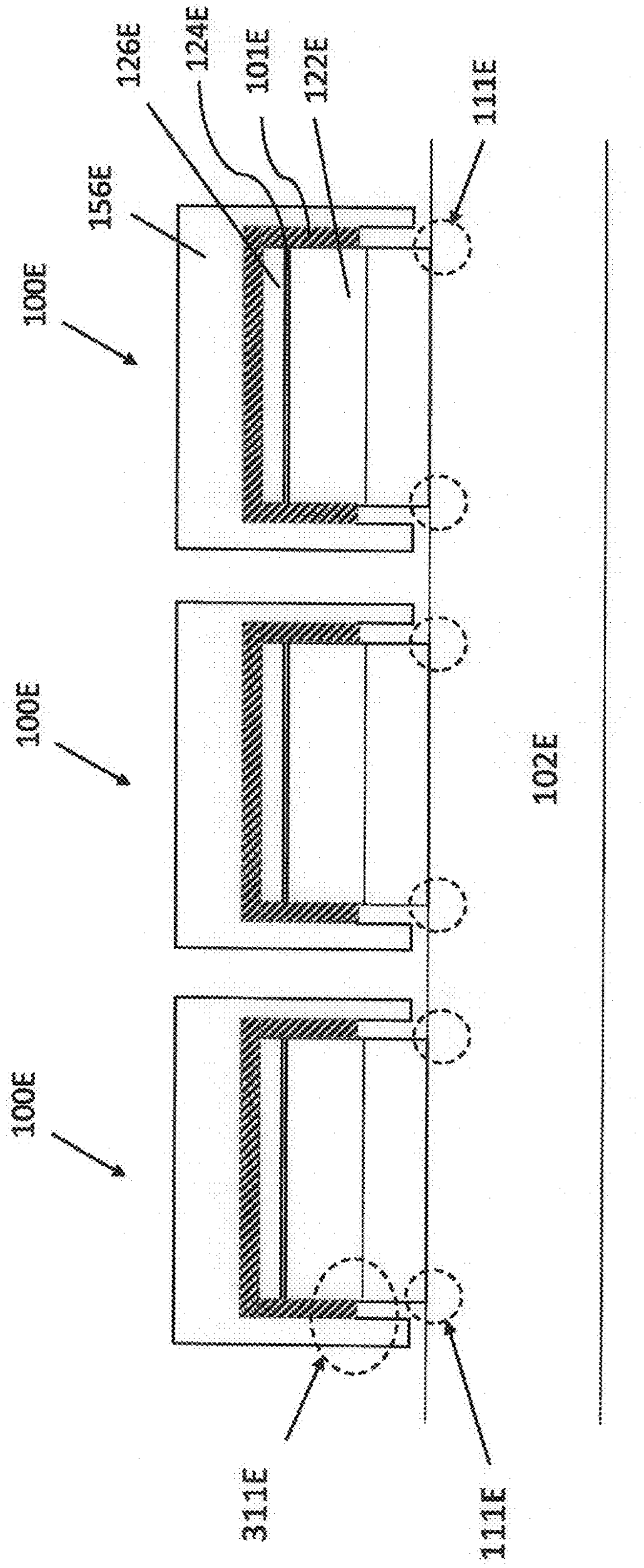
Figure 17:
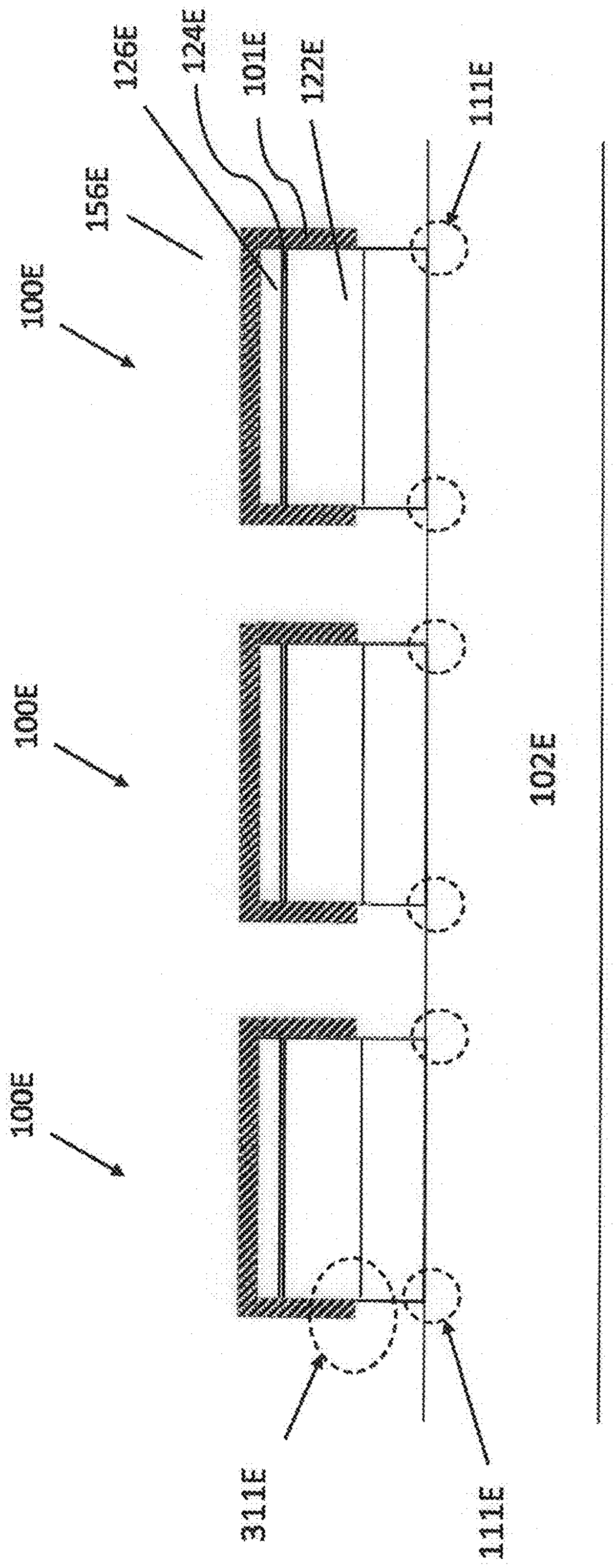

Referring to FIGS. 14-17, an alternate embodiment method for removing an isolation layer 101E in the street regions of a growth substrate 102E and form an undercut sidewall structure 311E are illustrated. In FIG. 14, a patterning protection layer 156E has been deposited and patterned to cover light emitting diode (LED) structures 100E and portions of the isolation layer 101E on the street regions 136E of the growth substrate 102E. FIG. 15 illustrates portions of the isolation layer 101E on the street region 136E have removed by a dry etching process or a chemical etching process. For applications requiring anisotropic structures, a dry etching process can be used to remove the isolation layer 101E on the street region 136E. FIGS. 16 and 17 illustrate the undercut sidewall structure 311E formed by wet etching to remove portions of the isolation layer 101E on the street 136E region. A wet chemical solution such as BOE can applied to start the wet etching on portions of the isolation layer 101E on the exposed sidewall of the light emitting diode (LED) structures 100E. By controlling the etching time and preventing the over-etching of the isolation layer 101E to the active layer 124 (FIG. 1), the undercut sidewall structure 311 can be formed. FIG. 16 shows the undercut sidewall structure 311. In addition, the isolation layer 101E is etched at the corner 111E, but the isolation layer 101E still covers a portion of the n-type layer 122E, the active layers 124E and the p-type layers 126E. This feature enhances reliability and prevents current leakage in the light emitting diode (LED) structures 100E. In FIG. 17 the patterning protection layer 156E has been removed.

Example (Method)

Figure 18:
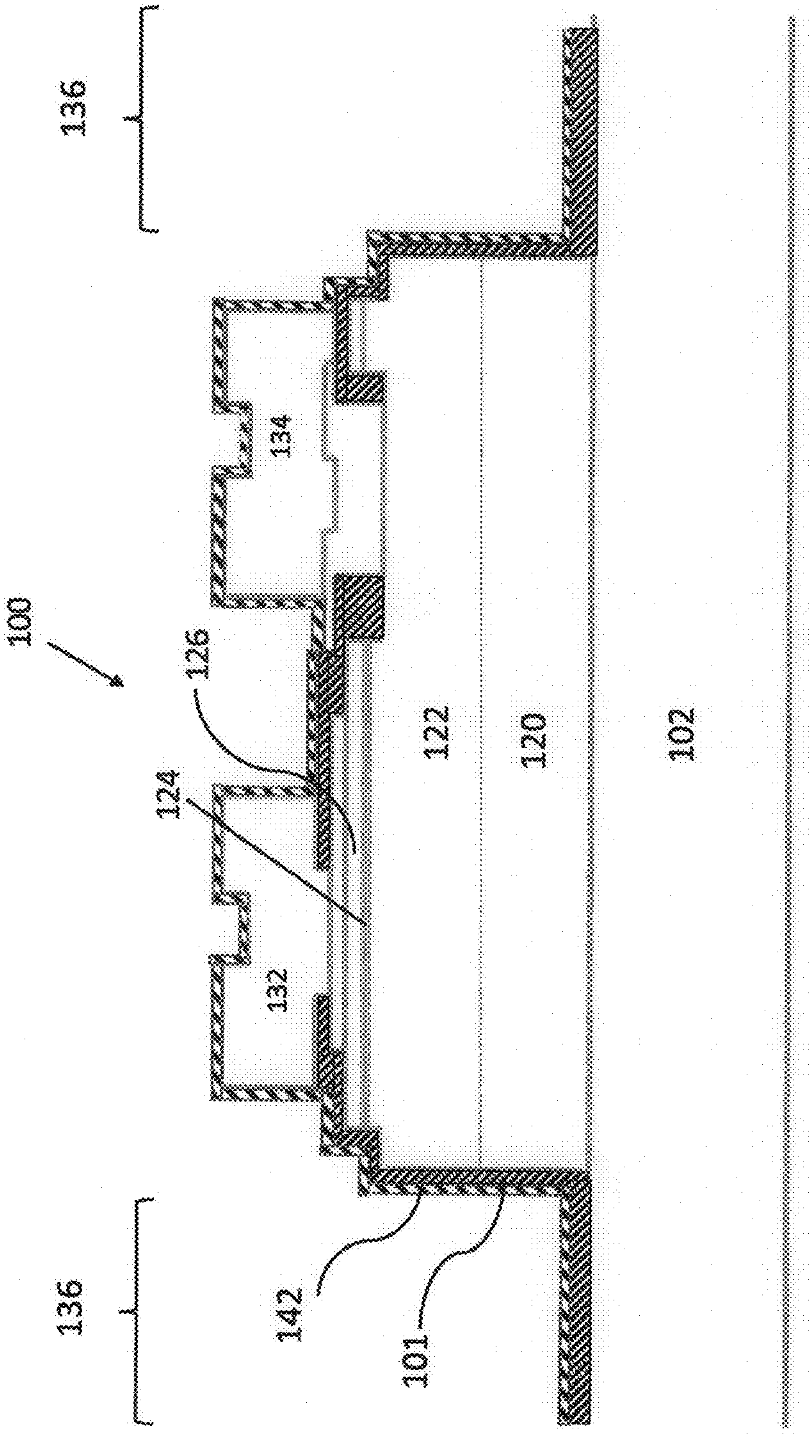
FIGS. 18-23 are enlarged schematic cross sectional views illustrating steps of the method for fabricating semiconductor light emitting devices (LEDs)
Figure 19:
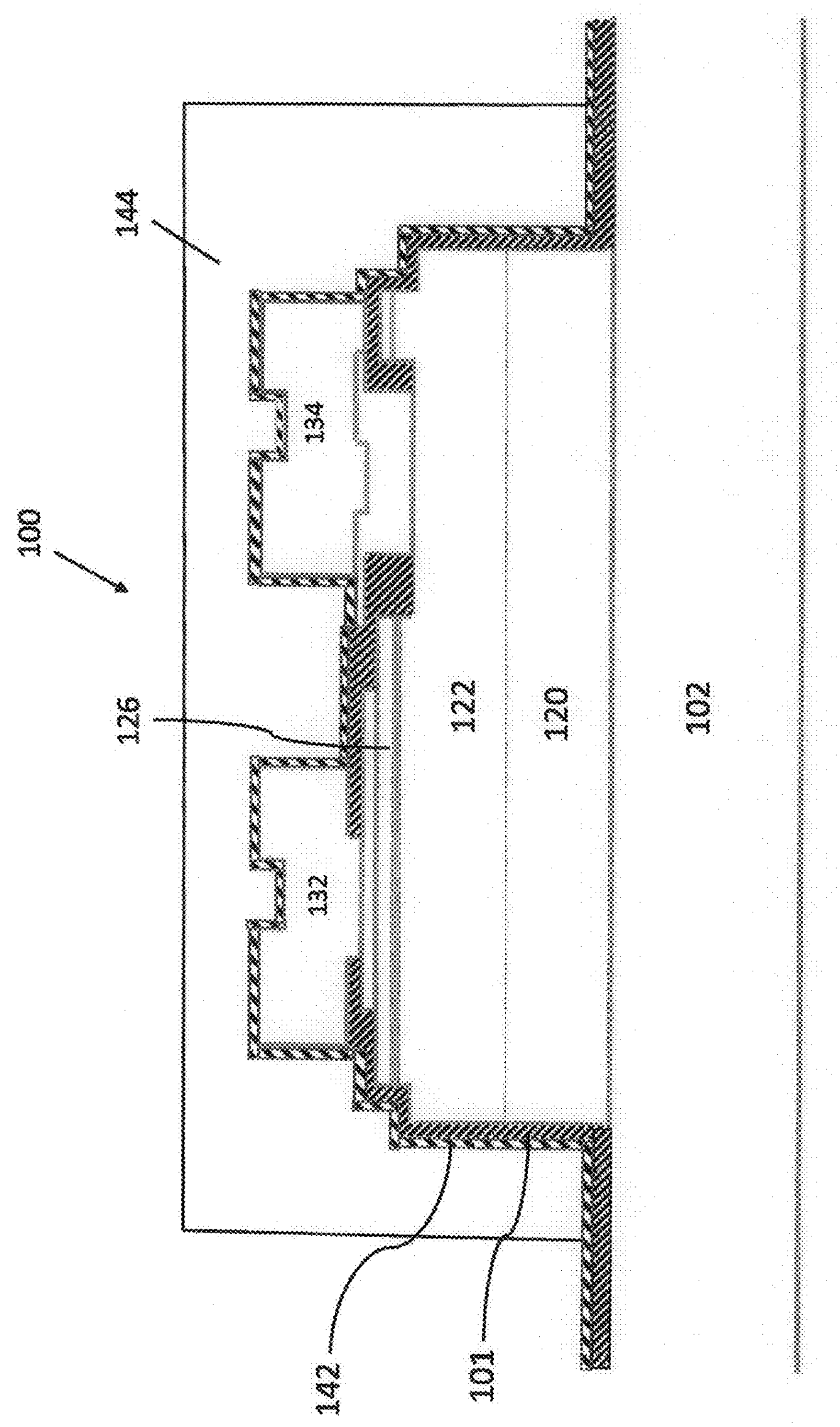

Referring to FIGS. 18-23, further aspects of the method are illustrated in an example. In FIG. 18, a covering channel layer 142 has been conformally deposited on the light emitting diode (LED) structure 100 (FIG. 1). The isolation layer 101 comprises $SiO_2$ (5000A) and the covering channel layer 142 comprises Ti (2000A). FIG. 19 illustrates a patterning protection layer 144 formed of photoresist patterned to cover the light emitting diode (LED) structure 100.

Figure 20:
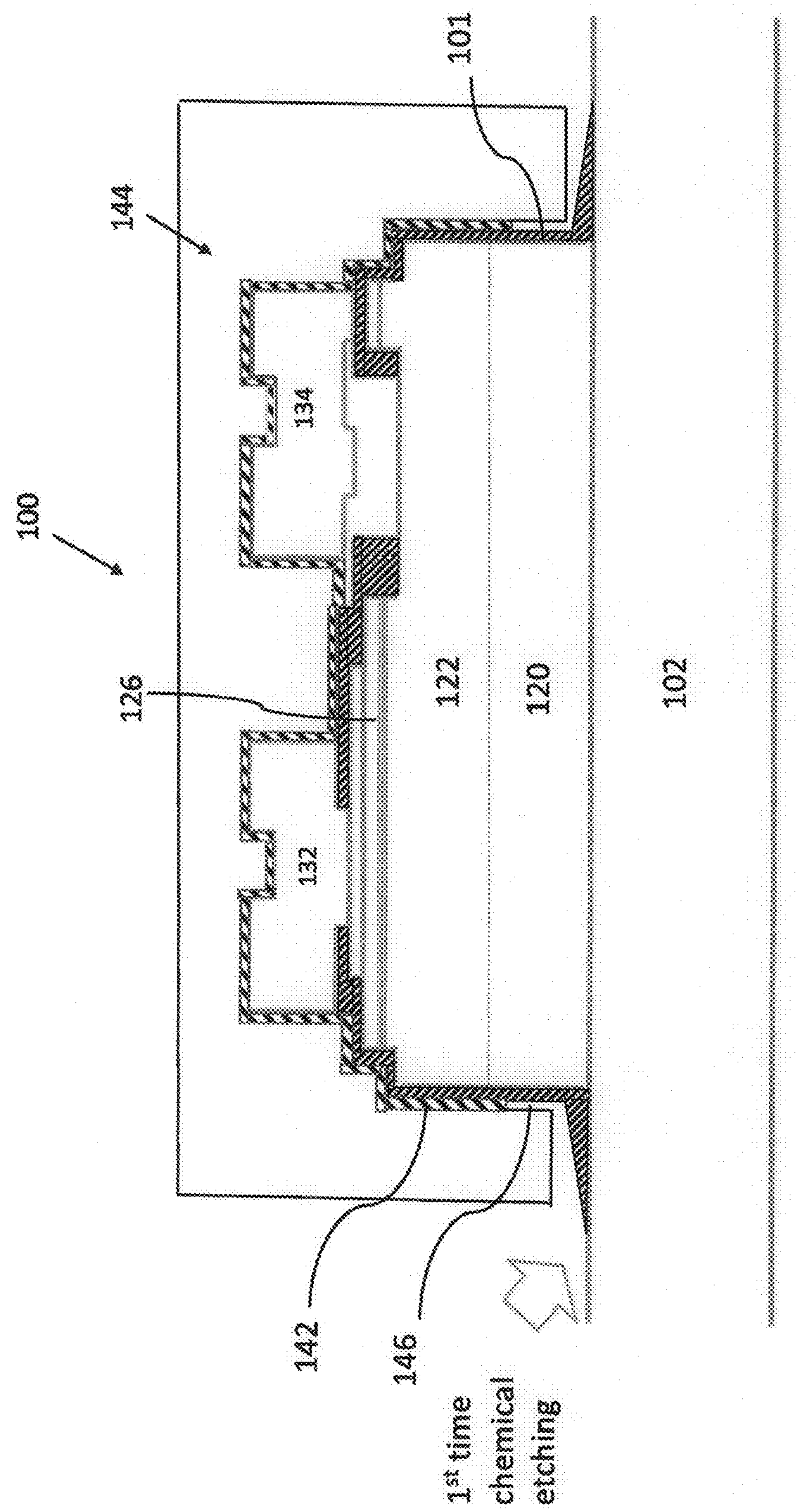
Figure 21:
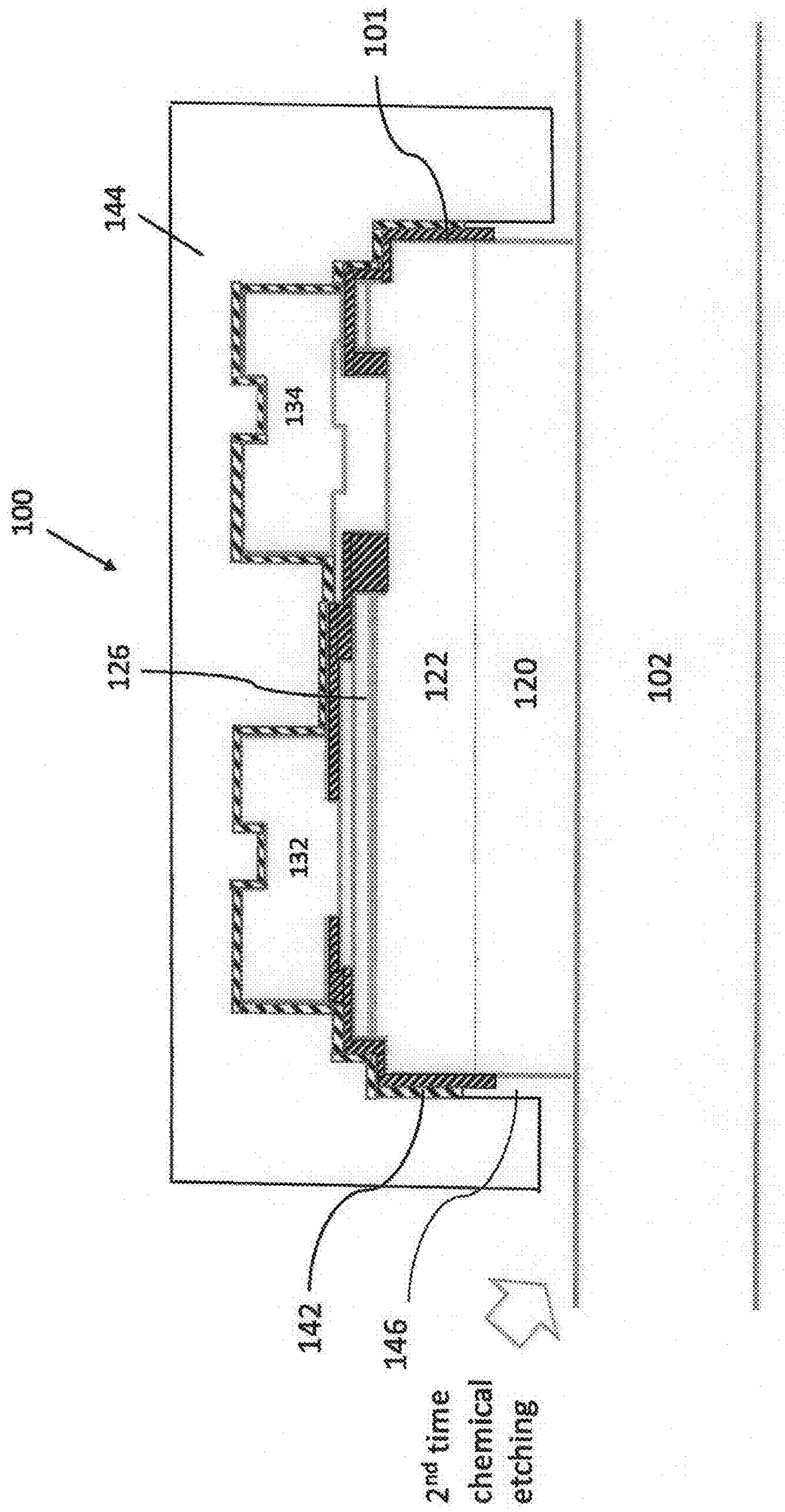
Figure 22:
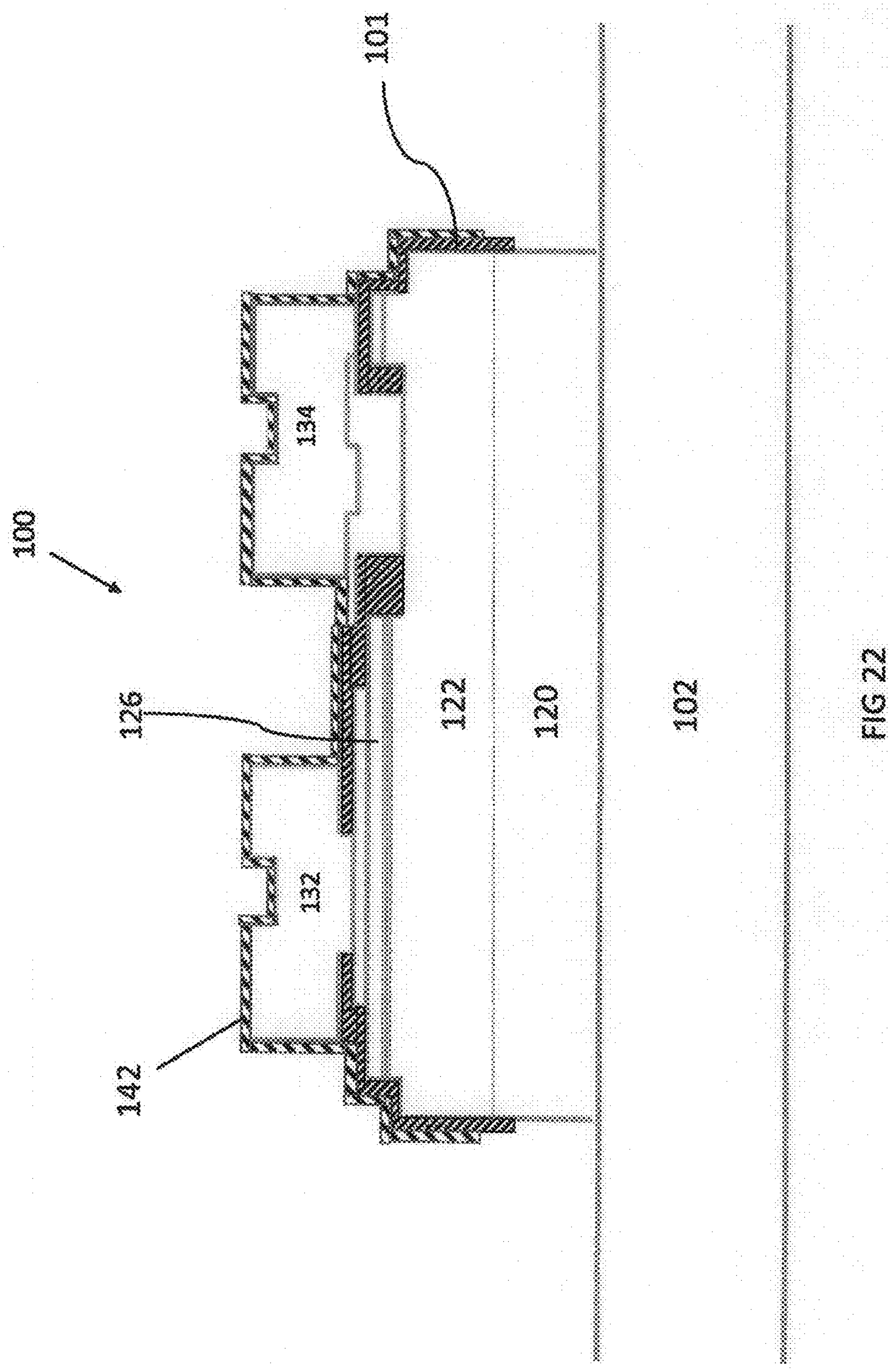
Figure 23:
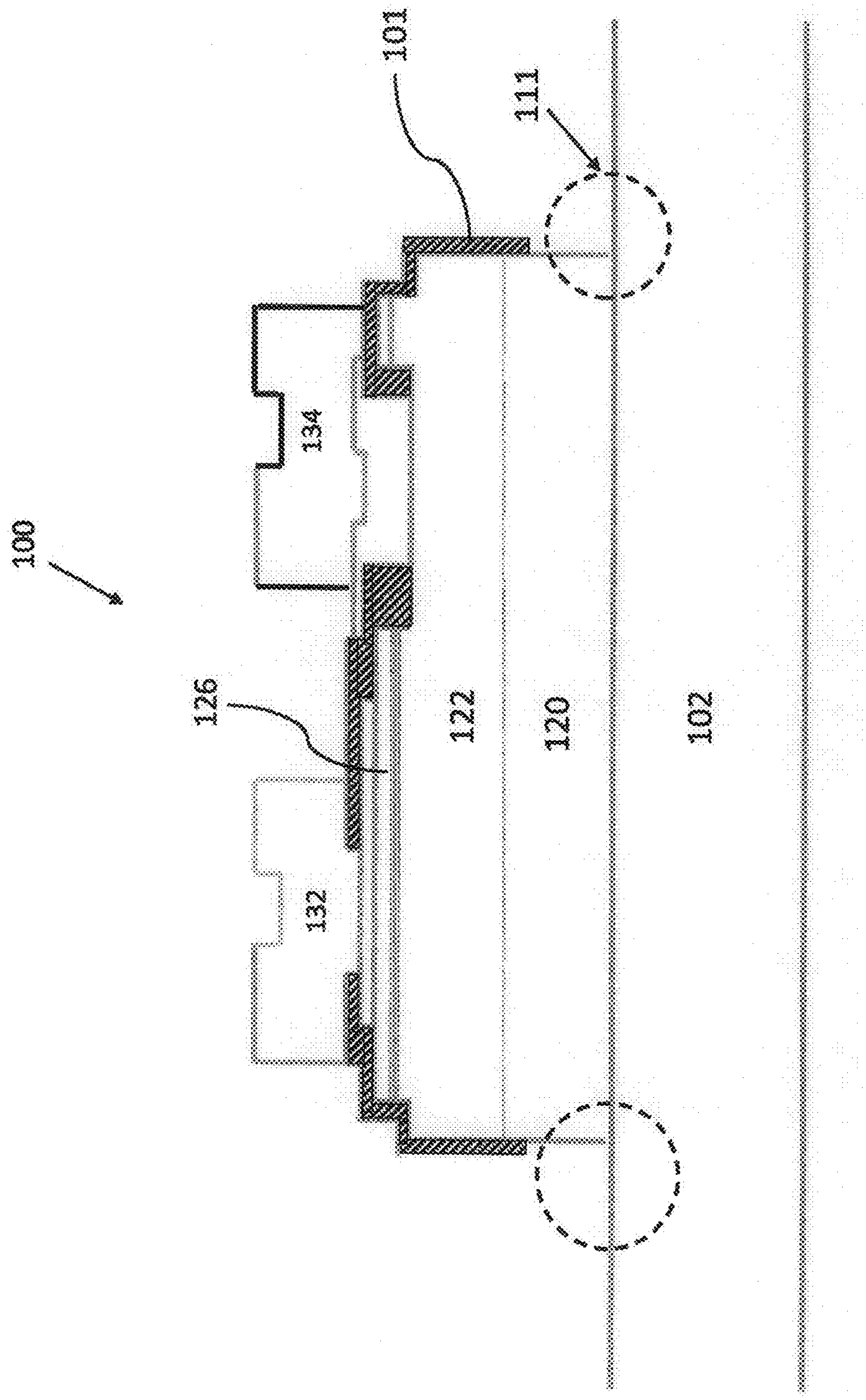

FIG. 20 illustrates a first etching process (e.g., dilute BOE) to remove a portion of the covering channel layer 142 and form an etching channel 146. Note that the $SiO_2$ isolation layer 101 at the corner 111 is partially removed by the first-time etching (e.g., dilute BOE). FIG. 21 illustrates a second etching process in the same dilute BOE solution, the Ti covering channel layer 142 is further etched and the isolation layer 101 at the corner 111 has been removed. FIG. 22 illustrates the patterning protection layer 144 has been removed. FIG. 23 shows the Ti covering channel layer 142 has been removed/etched using a Ti etcher (i.e., does not etch the $SiO_2$). Note that the corner 111 of the light emitting diode (LED) structure has no isolation layer 101.

Example (Alternate Embodiment Method)

Figure 24:
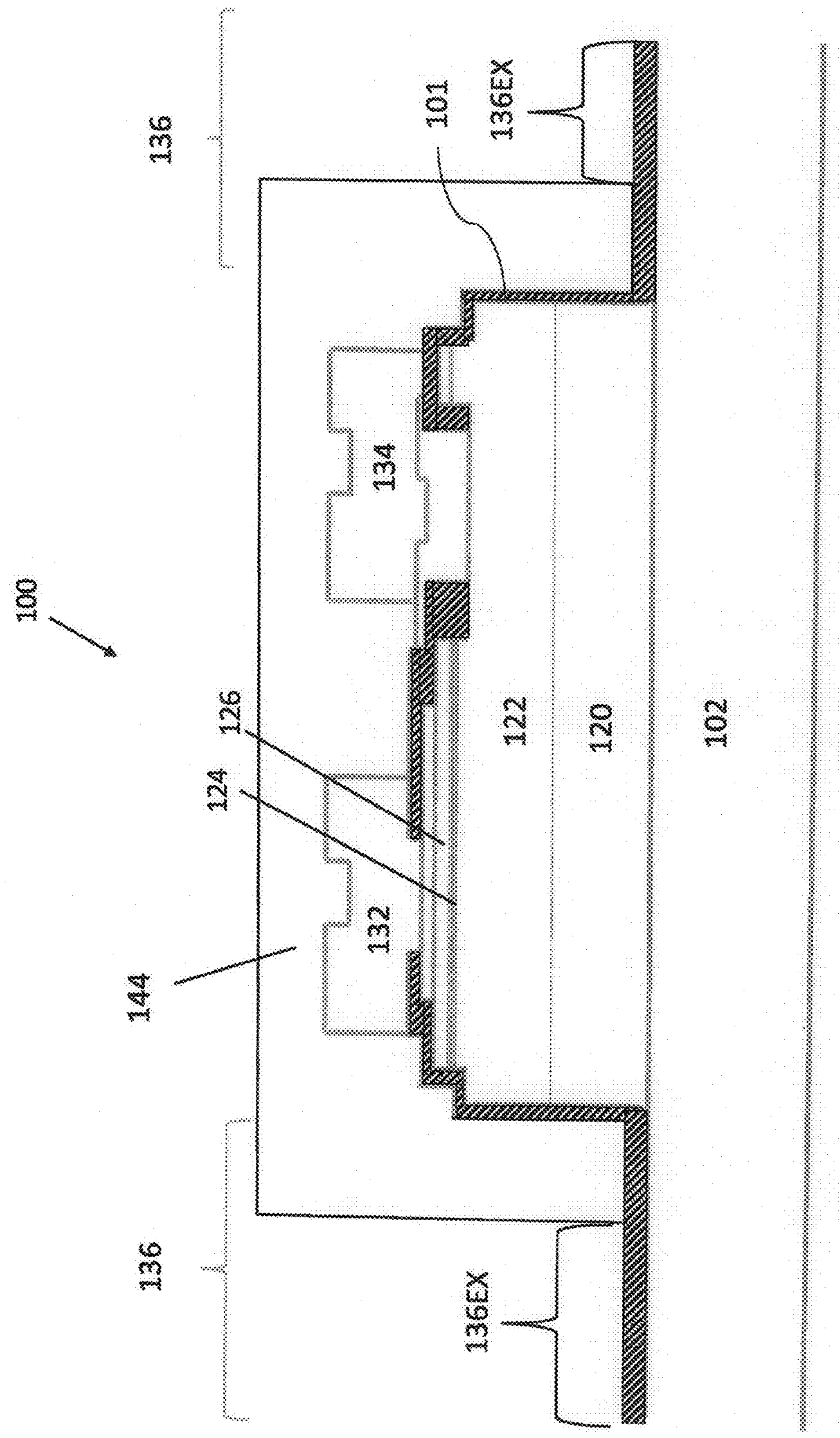
FIGS. 24-27 are enlarged schematic cross sectional views illustrating steps of the alternate embodiment method for fabricating semiconductor light emitting devices (LEDs)
Figure 25:
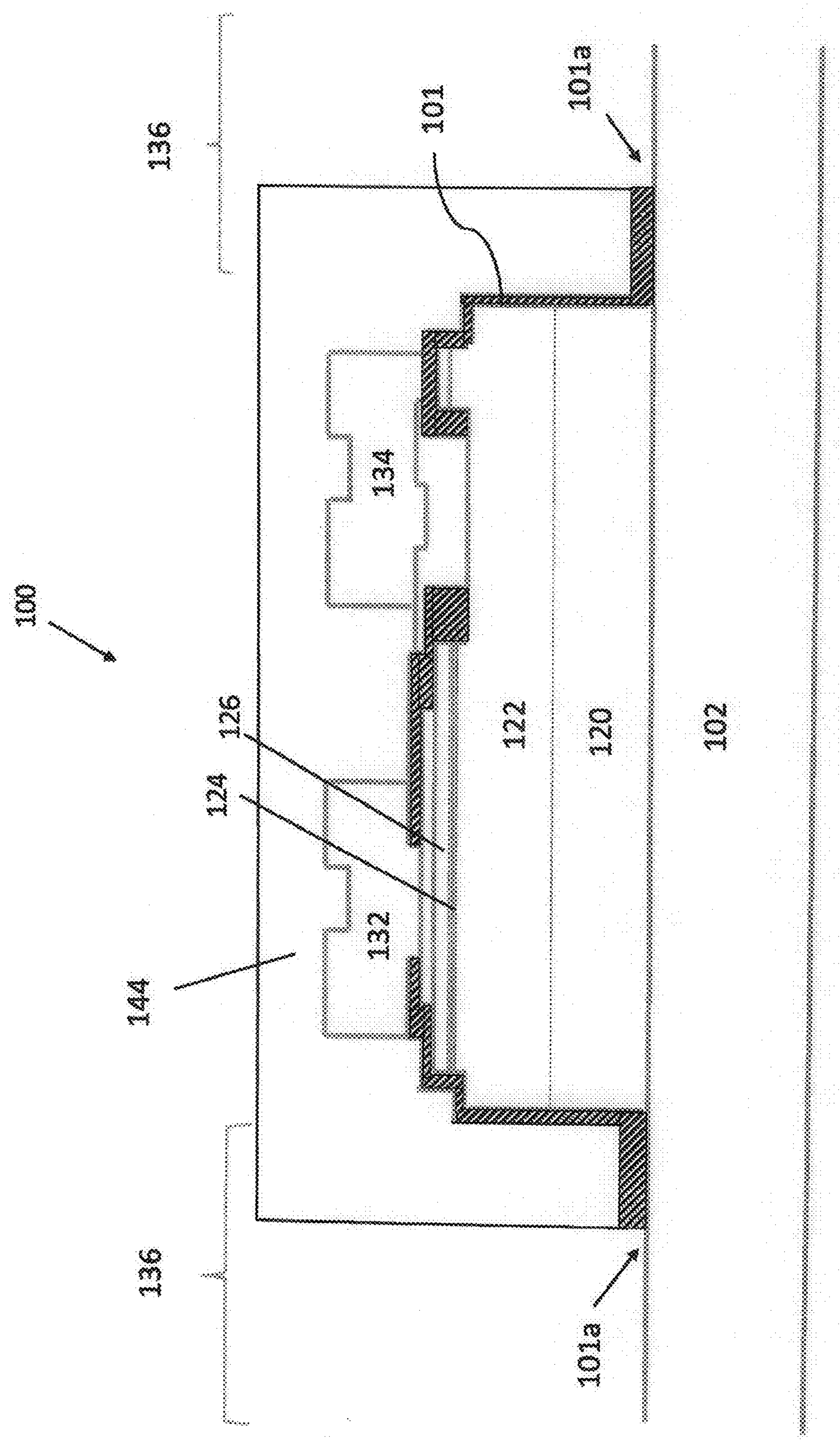
Figure 26:
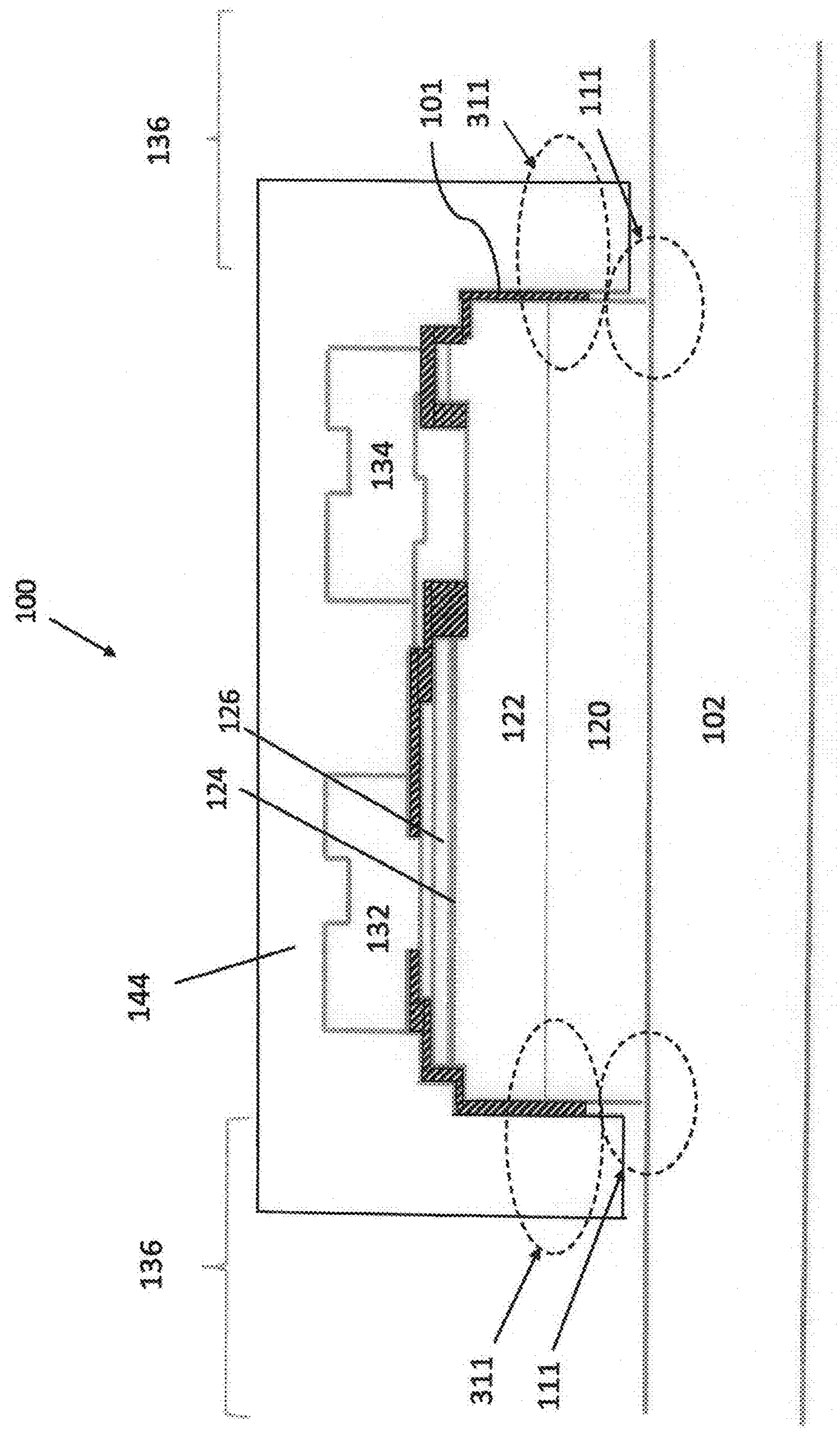
Figure 27:
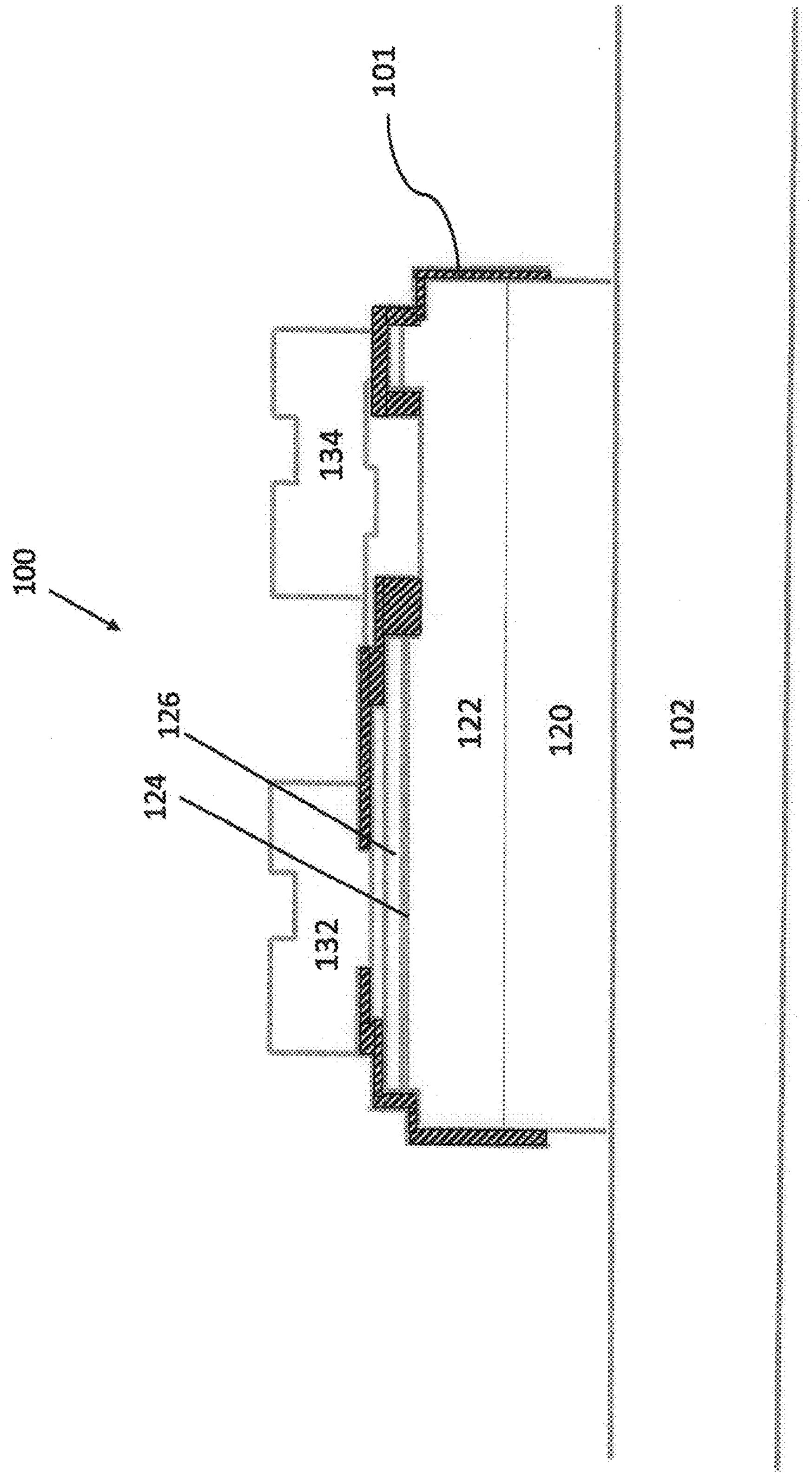

Referring to FIGS. 24-27, further aspects of the alternate embodiment method are illustrated in an example. In FIG. 24 a patterning protection layer 144 covers light emitting diode (LED) structure 100 and a portion of the isolation layer 101 on the street regions 136 of the growth substrate 102. The isolation layer 101 is exposed in an exposed street region 136EX. In FIG. 25, the exposed isolation layer 101 at exposed street region 136EX can be etched using a dry etching process. FIG. 26 illustrates, a wet chemical solution such as BOE can be applied to start the wet etching from the exposed sidewall isolation layer 101*a*. The wet chemical solution is configured to etch the isolation layer 101 underneath the patterning protection layer 144. The etching time is controlled to prevent the over etching of the isolation layer 101 to the active layers 124. FIG. 26 also shows an undercut sidewall etching structure 311 and with the isolation layer 101 removed at the corner 111. However, the isolation layer 101 still covers a portion of the n-type layer 122, the active layers 124, and the p-type layer 126. In FIG. 27 the patterning protection layer 144 has been removed.

Example (One Embodiment of the Laser Lift Off (LLO) Process)

Figure 28:
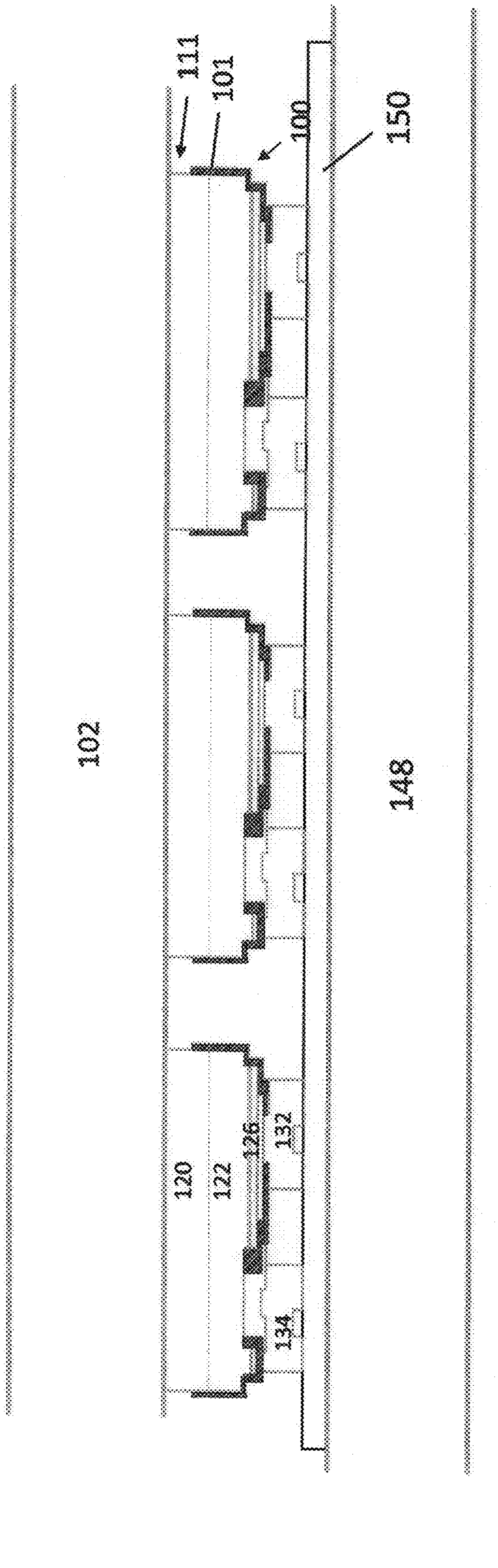
FIGS. 28-30 are enlarged schematic cross sectional views illustrating a laser lift off (LLO) step of the method or the alternate embodiment method for fabricating semiconductor light emitting devices (LEDs)
Figure 29:
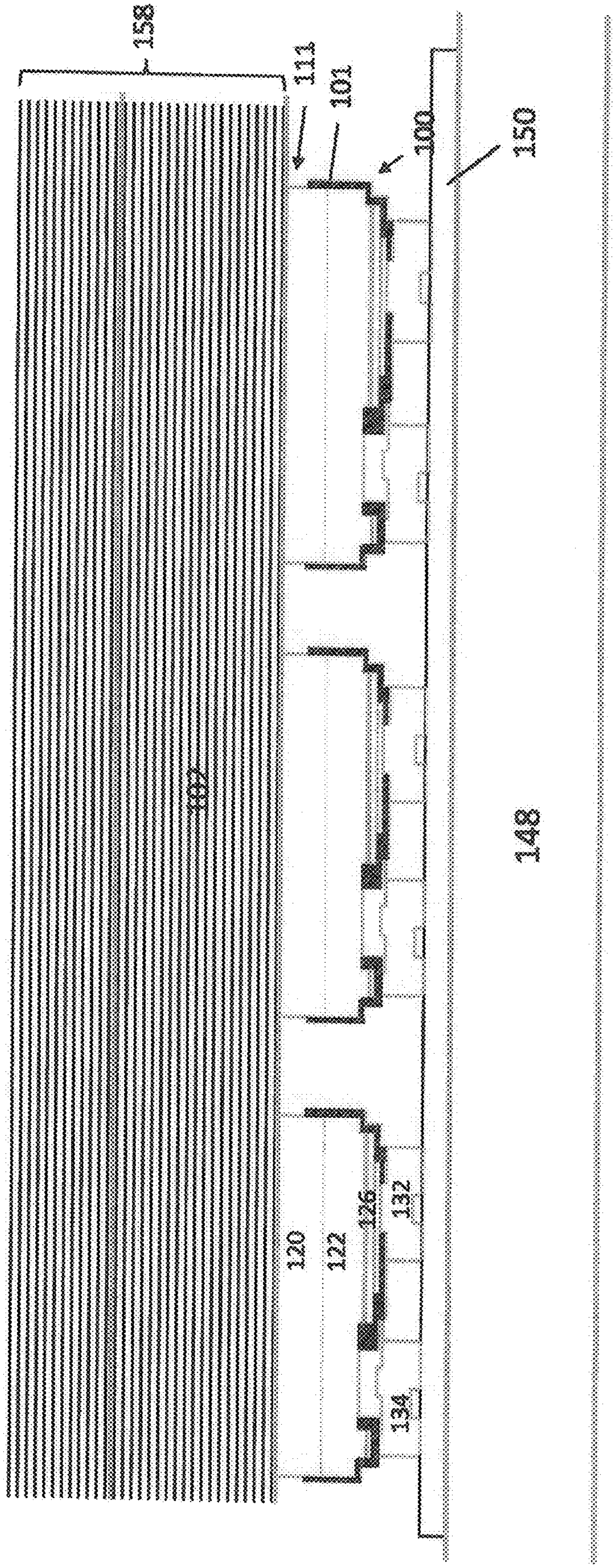
Figure 30:
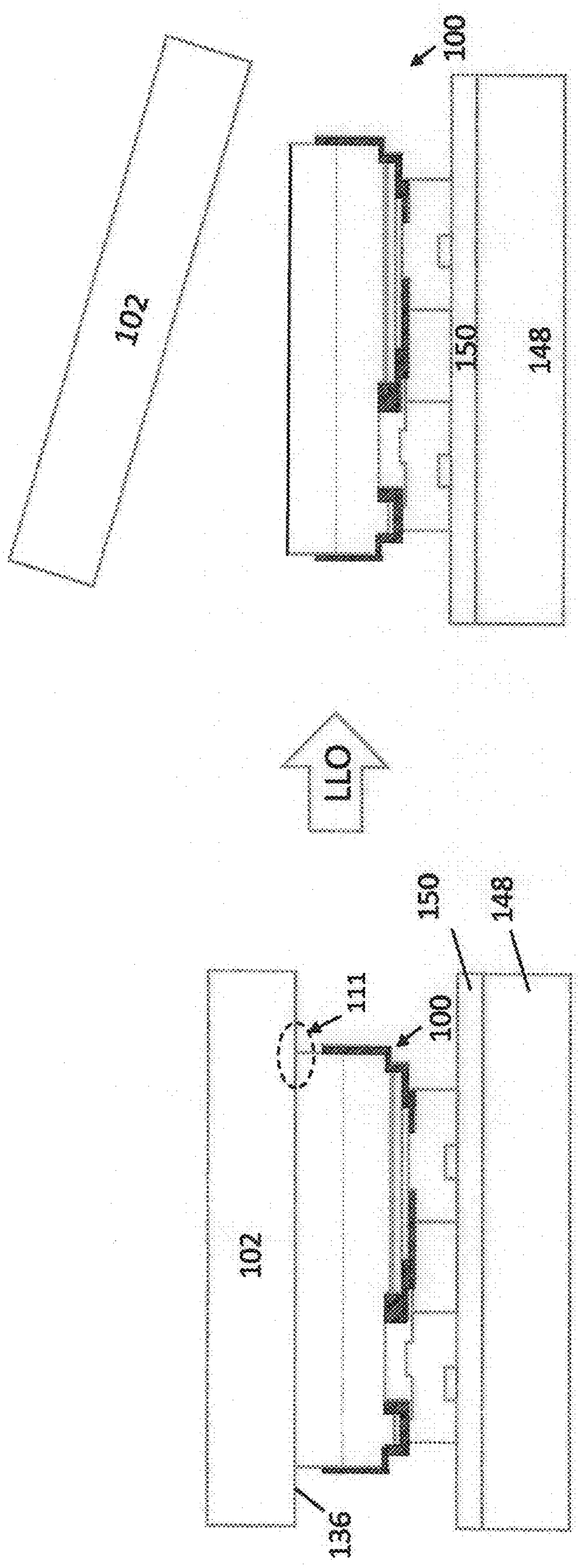
Figure 31A:
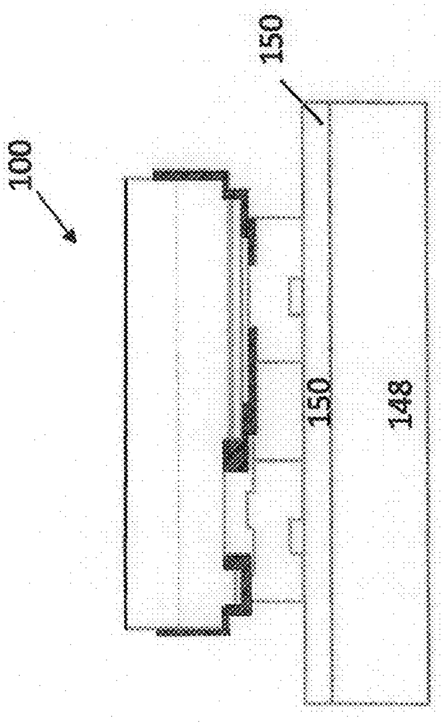
FIG. 31A is a cross sectional view taken along section line 31A-31A of FIG. 31 illustrating a single semiconductor light emitting device (LED) structure.
Figure 31:
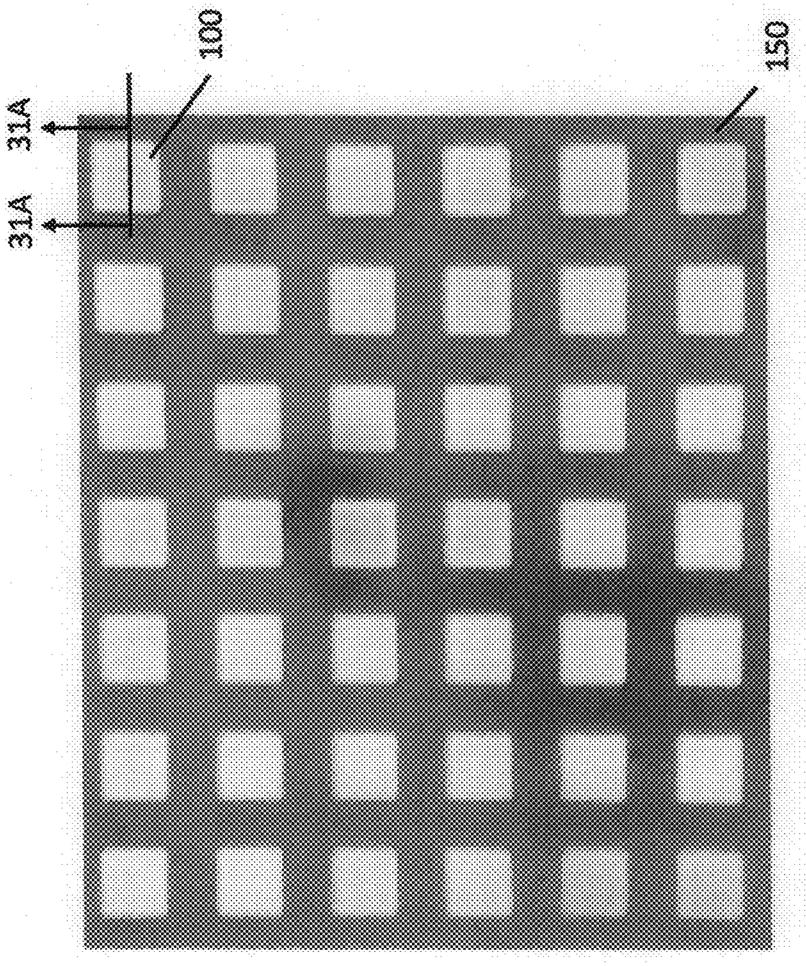
FIG. 31 is a plan view of a carrier having a plurality of semiconductor light emitting device (LED) structures thereon fabricated using the method or the alternate embodiment method.

Referring to FIGS. 28-30, further aspects of the laser lift off (LLO) process are illustrated. As shown in FIG. 28, the corner 111 of the isolation layer 101 has been removed from the light emitting diode (LED) structures 100 by using the method or the alternate embodiment method. FIG. 29 illustrates a laser beam 158 used to perform the LLO process. FIG. 30 illustrates that there is no isolation residue (i.e., no $SiO_2$ residue on the growth substrate 102 in the street regions 136 and no $SiO_2$ peeled residue on the elastic polymer material 150 in the street region 136). FIG. 31 and FIG. 31A also illustrate the lack of $SiO_2$ residue on the carrier 148.

Example (Prior Art Laser Lift Off (LLO) Process)

Figure 32:
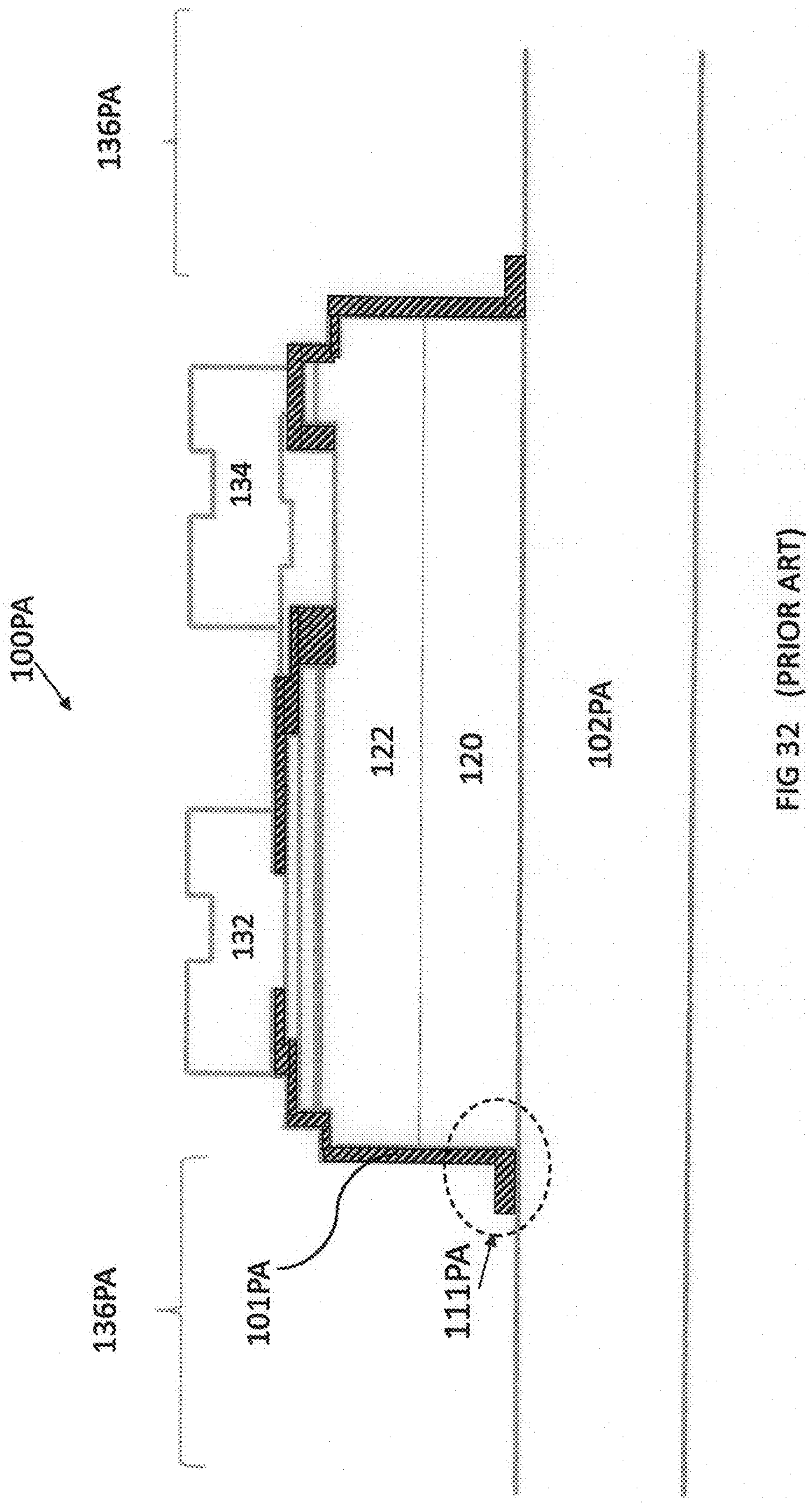
FIG 32 (PRIOR ART)
FIGS. 32-35 are enlarged schematic cross sectional views illustrating aspects of a prior art laser lift off (LLO) process.
Figure 33:
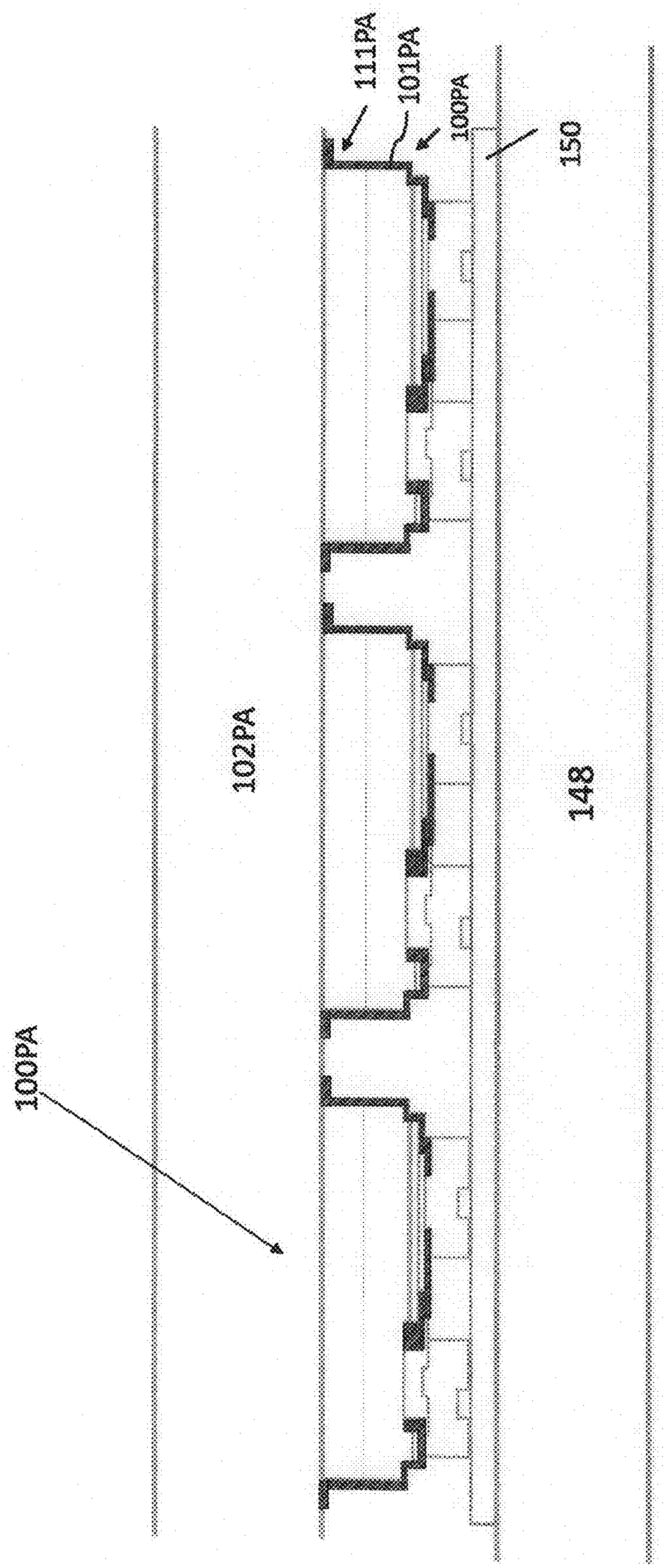
FIG 33 (PRIOR ART)
Figure 34:
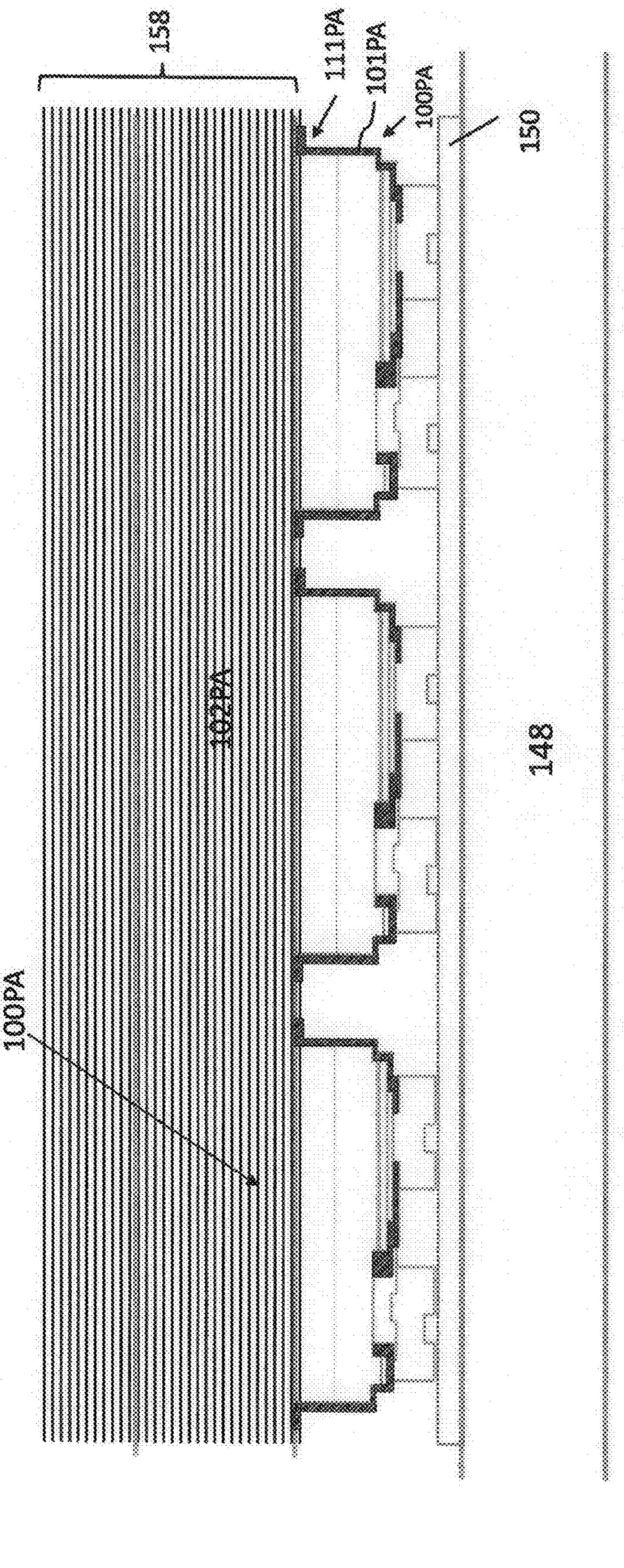
FIG 34 (PRIOR ART)
Figure 35:
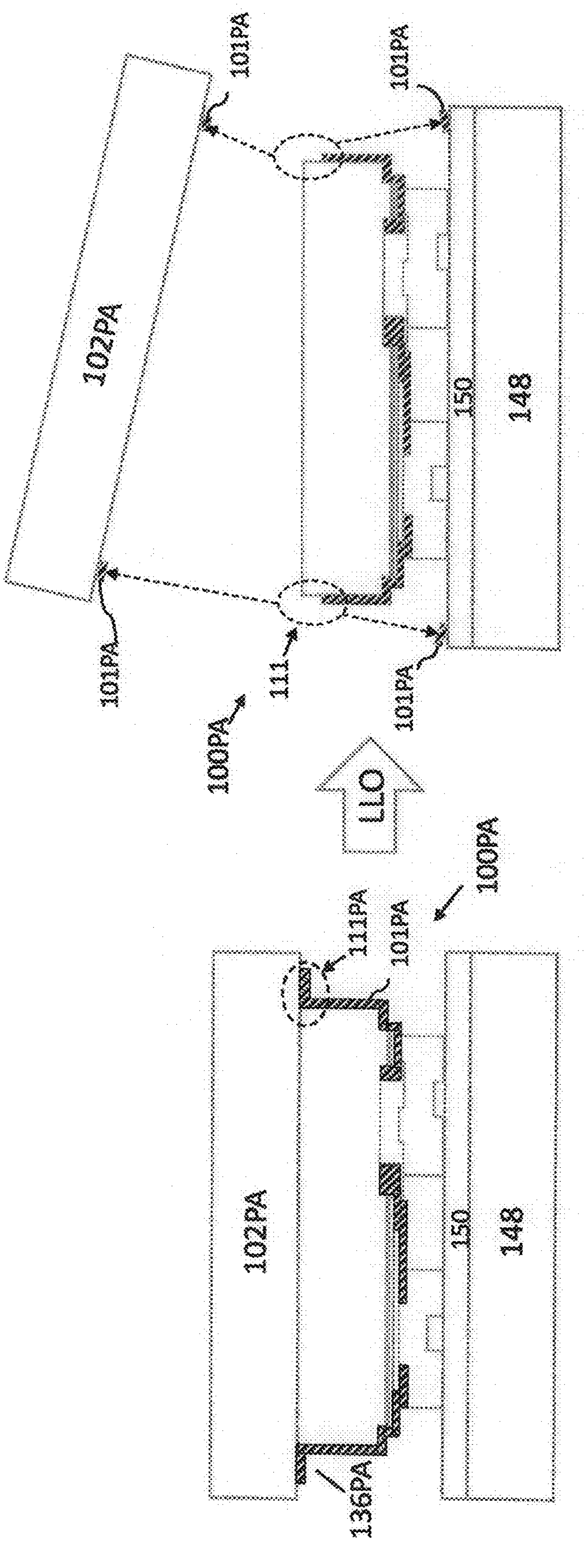
FIG 35 (PRIOR ART)
Figure 36A:
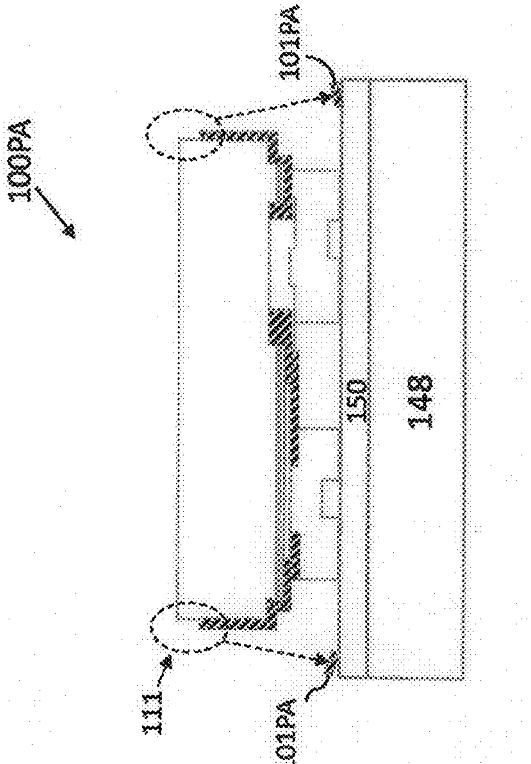
FIG. 36A is a cross sectional view taken along section line 36A-36A of FIG. 36 illustrating a single semiconductor light emitting device (LED) structure on the carrier.
Figure 36:
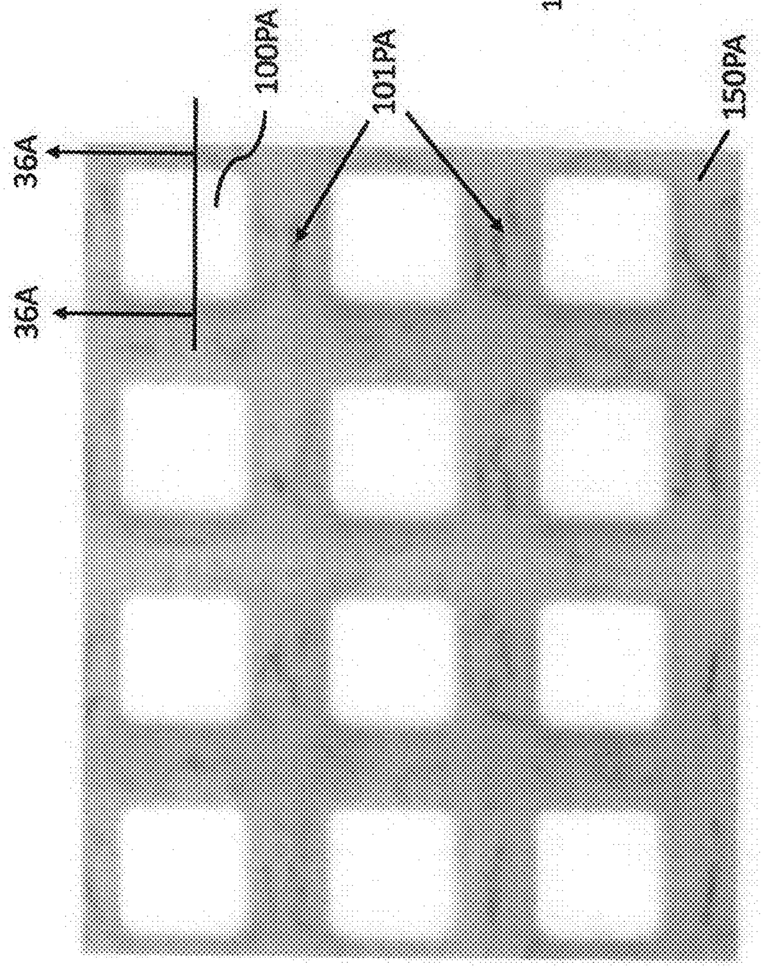
FIG 36 (PRIOR ART)
FIG. 36 is a plan view of a carrier having a plurality of semiconductor light emitting device (LED) structures thereon fabricated using the prior art laser lift off (LLO) process.

Referring to FIGS. 32-36, aspects of a prior art laser lift off (LLO) process for fabricating prior art light emitting diode (LED) structures 100PA, are illustrated. FIG. 32 illustrates a conventional flip chip light emitting diode (LED) structure 100PA on a sapphire growth substrate 102PA. A portion of an isolation layer 101PA remains on the street regions 136PA and the corner 111PA after a conventional chip fabrication process. FIG. 33 illustrates a wafer form of the conventional flip chip light emitting diode (LED) structures 100PA on the growth substrate 102PA flipped and bonded to a carrier 148 having an elastic polymer material 150. A corner 111PA of the isolation layer 101PA remains on the street regions 136PA of the growth substrate 102PA. FIG. 34 illustrates a laser beam 158, the carrier 148 and the elastic polymer material 150, as previously described, used to perform the (LLO) process. FIG. 35 illustrates that there may be isolation residue 101PA (e.g., $SiO_2$ residue) on the growth substrate 102PA in the street regions 136PA and peeled isolation residue 101PA (e.g., $SiO_2$ residue) on the elastic polymer material 150 in the street region 136PA. FIG. 36 and FIG. 36A also illustrate the isolation residue 101PA (e.g., $SiO_2$ residue) on the elastic polymer material 150 of the carrier 148. The present method eliminates the isolation residue 101PA to provide more reliable and robust light emitting diode (LED) structures 100 (FIG. 2).

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

We claim:

1. A method for fabricating semiconductor light emitting devices (LEDs) comprising:

forming a plurality of light emitting diode (LED) structures on a growth substrate, the light emitting diode (LED) structures including epitaxial structures having sidewalls and P-N junctions on the sidewalls;

forming an isolation layer on the light emitting diode (LED) structures including on the sidewalls of the epitaxial structures, the isolation layer including corners at intersections between the light emitting diode (LED) structures and the growth substrate;

forming an etchable covering channel layer on the isolation layer;

forming a patterning protection layer on the etchable covering channel layer having a plurality of openings aligned with the corners of the isolation layer;

etching a plurality of etching channels in the etchable covering channel layer using a first etching process selective to the covering channel layer, in which a first etchant passes through the openings in the patterning protection layer to selectively etch away portions of the etchable covering channel layer leaving the patterning protection layer covering the light emitting diode (LED) structures but not the corners of the isolation layer, and with the plurality of etching channels shaped and sized to surround the corners of the isolation layer;

removing the corners of the isolation layer by etching the isolation layer using a second etching process in which a second etchant passes through the plurality of etching channels to remove the corners, leaving the isolation layer covering the sidewalls and the P-N junctions;

removing the patterning protection layer and the etchable covering channel layer; and providing a carrier having an elastic polymer material thereon;

transmitting the light emitting diode (LED) structures on the growth substrate to the carrier by flip chip bonding the light emitting diode (LED) structures to the elastic polymer material on the carrier while protecting the P-N junctions using the isolation layer; and separating the growth substrate from the light emitting diode (LED) structures using a laser lift off process without damaging the isolation layer on the P-N junctions.

2. The method of claim 1 wherein the etchable covering channel layer comprises a metal and the first etching process comprises wet chemical etching selective to the metal, and wherein the isolation layer comprises an oxide and the second etching process comprises BOE.

3. The method of claim 1 wherein the growth substrate includes a plurality of streets separating the light emitting diode (LED) structures and following the forming of the isolation layer, the isolation layer covers the plurality of streets.

4. The method of claim 1 wherein the growth substrate includes a plurality of streets separating the light emitting diode (LED) structures and following the forming of the isolation layer, the isolation layer only partially covers the plurality of streets.

* * * * *